(12) United States Patent
  Nakao

(10) Patent No.: US 11,094,104 B2
(45) Date of Patent: Aug. 17, 2021

(54) INFORMATION PROCESSING DEVICE, INFORMATION PROCESSING METHOD AND NON-TRANSITORY COMPUTER READABLE MEDIUM

(71) Applicant: KYOTO UNIVERSITY, Kyoto (JP)

(72) Inventor: Megumi Nakao, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 16/476,199

(22) PCT Filed: Dec. 20, 2017

(86) PCT No.: PCT/JP2017/045816
§ 371 (c)(1),
(2) Date: Jul. 5, 2019

(87) PCT Pub. No.: WO2018/131416
PCT Pub. Date: Jul. 19, 2018

(65) Prior Publication Data
US 2019/0355167 A1   Nov. 21, 2019

(30) Foreign Application Priority Data
Jan. 11, 2017   (JP) .............................. JP2017-002641

(51) Int. Cl.
  *G06T 15/00*  (2011.01)
  *G06T 15/08*  (2011.01)
  *G06T 17/20*  (2006.01)
(52) U.S. Cl.
  CPC .............. *G06T 15/08* (2013.01); *G06T 17/20* (2013.01); *G06T 2210/41* (2013.01)

(58) Field of Classification Search
  CPC .......... G06T 15/08; G06T 15/20; G06T 17/20
  USPC ......................................................... 345/420
  See application file for complete search history.

(56) References Cited

U.S. PATENT DOCUMENTS

| | | | |
|---|---|---|---|
| 8,965,487 B2* | 2/2015 | Bouma ................ | A61B 5/0059 600/476 |
| 9,208,558 B2* | 12/2015 | Dean ..................... | G06T 7/0012 |
| 9,734,589 B2* | 8/2017 | Yu ........................ | G06K 9/00335 |
| 2006/0058592 A1 | 3/2006 | Bouma et al. | |

FOREIGN PATENT DOCUMENTS

| | | |
|---|---|---|
| JP | 2011-177535 A | 9/2011 |
| JP | 2015-097724 A | 5/2015 |

OTHER PUBLICATIONS

Haouchine et al.; "Image-guided Simulation of Heterogeneous Tissue Deformation for Augmented Reality During Hepatic Surgery;" IEEE International Symposium on Mixed and Augmented Reality 2013, Science and Technology Proceedings; 2013; pp. 199-208.

(Continued)

*Primary Examiner* — Thomas J Lett
(74) *Attorney, Agent, or Firm* — Oliff PLC

(57) ABSTRACT

An information processing device has a computation unit for determining an optimal solution of an external force that minimizes a difference between a surface image of an elastic body captured from at least one direction, and a rendering image as observed from the direction which is generated from a three-dimensional model of the elastic body elastically deformed by an unobserved external force.

11 Claims, 18 Drawing Sheets

(56) References Cited

OTHER PUBLICATIONS

Feb. 27, 2018 Search Report issued in International Application No. PCT/JP2017/045816.
Oct. 7, 2020 Extended Search Report issued in European Patent Application No. 17891609.4.
Haouchine et al; "Single View Augmentation of 3D Elastic Objects;" IEEE International Symposium on Mixed and Augmented Reality (ISMAR); pp. 229-236; Sep. 10, 2014.
Wuhrer et al; "Finite element based tracking of deforming surfaces;" Graphical Models; vol. 77; pp. 1-17; Nov. 6, 2014.
Morita et al; "Elastic Modulus Estimation based on Local Displacement Observation of Elastic Body;" 39th Annual International Conference of the IEEE Engineering in Medicine and Biology Society (EMBC) IEEE; pp. 2138-2141; Jul. 11, 2017.
Saito et al; "[Poster] Deformation Estimation of Elastic Bodies Using Multiple Silhouette Images for Endoscopic Image Augmentation;" IEEE International Symposium on Mixed and Augmented Reality; pp. 170-171; Sep. 29, 2015.

\* cited by examiner

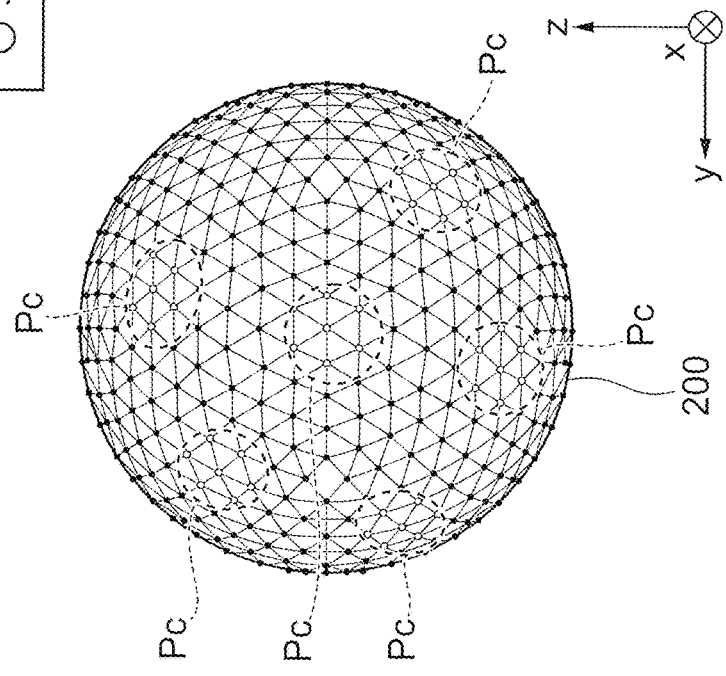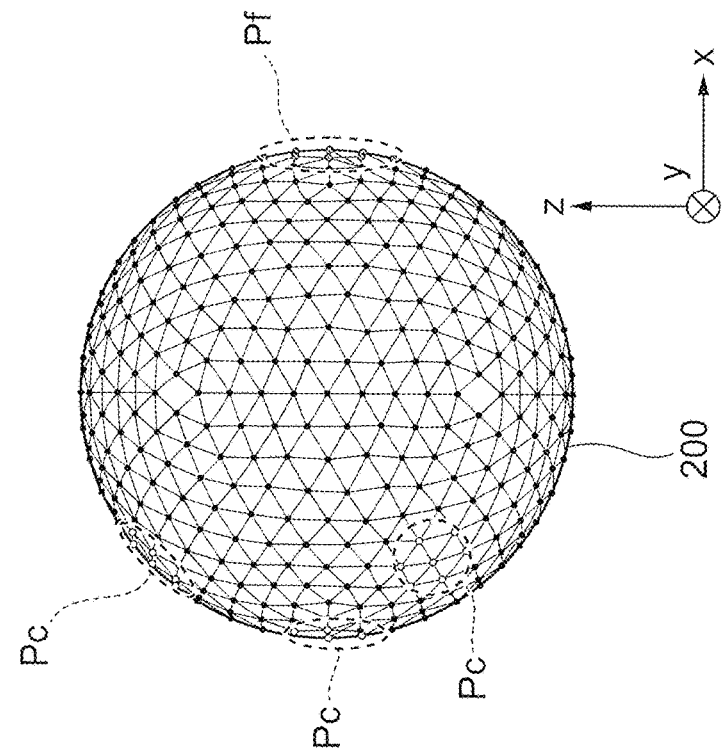

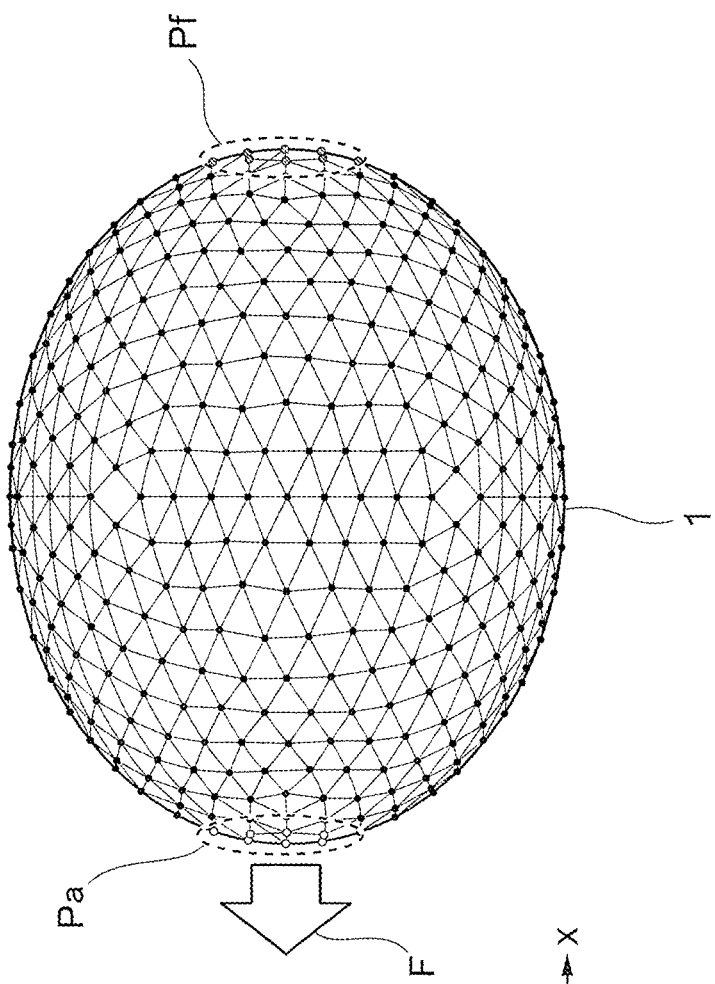
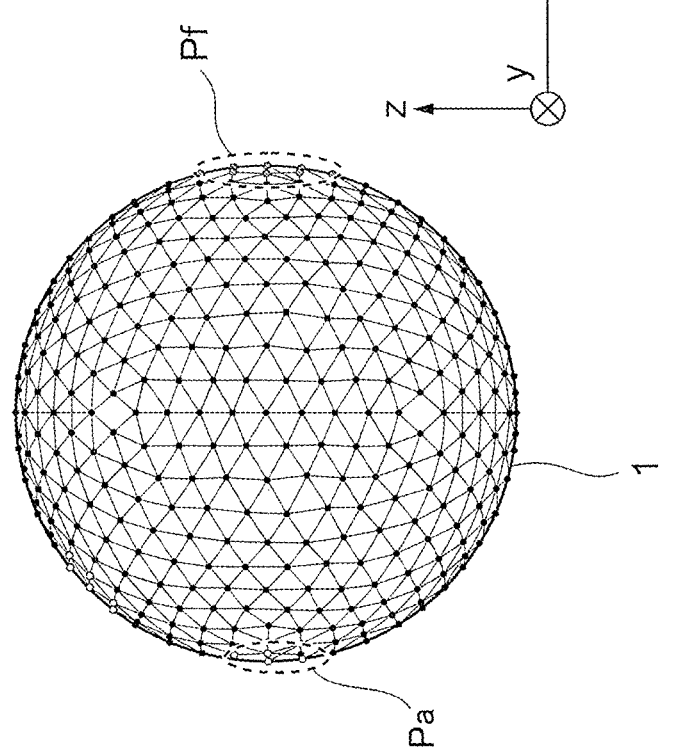

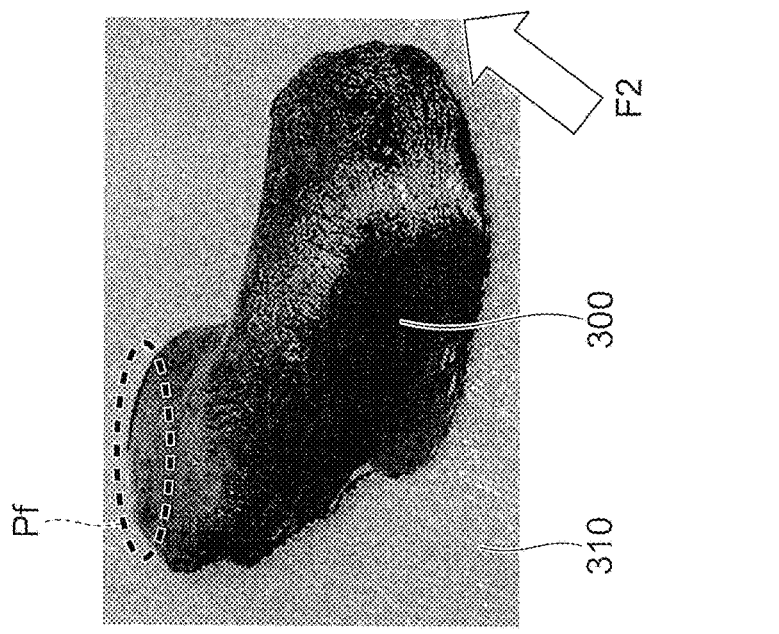
FIG.15A INITIAL SHAPE
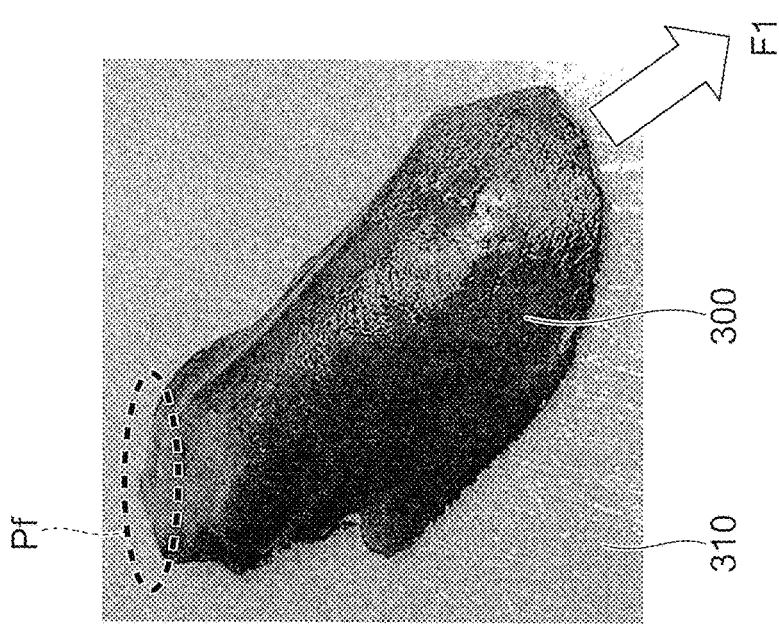
FIG.15B DEFORMED SHAPE 1
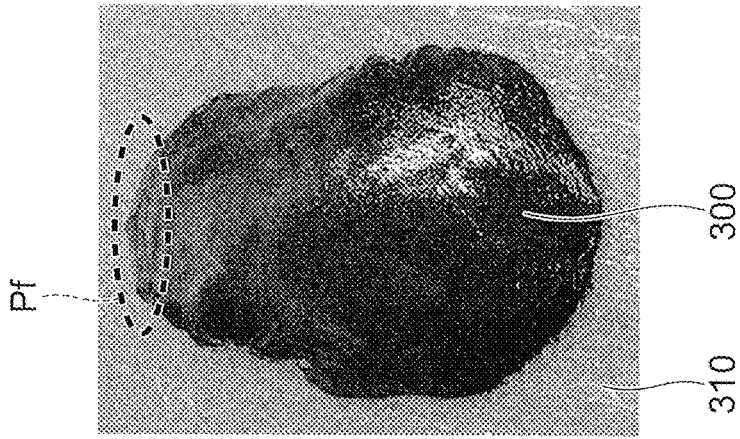
FIG.15C DEFORMED SHAPE 2

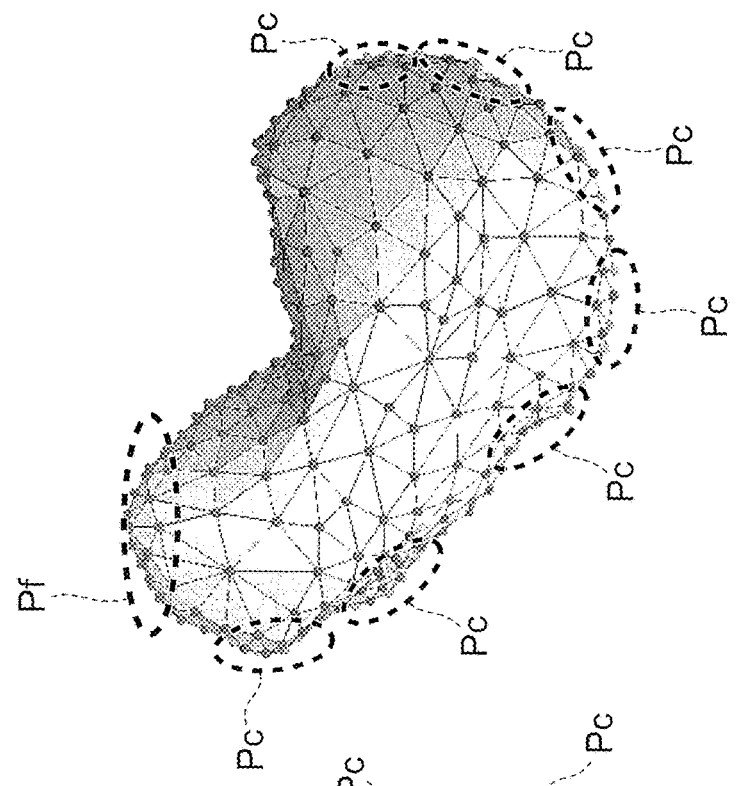
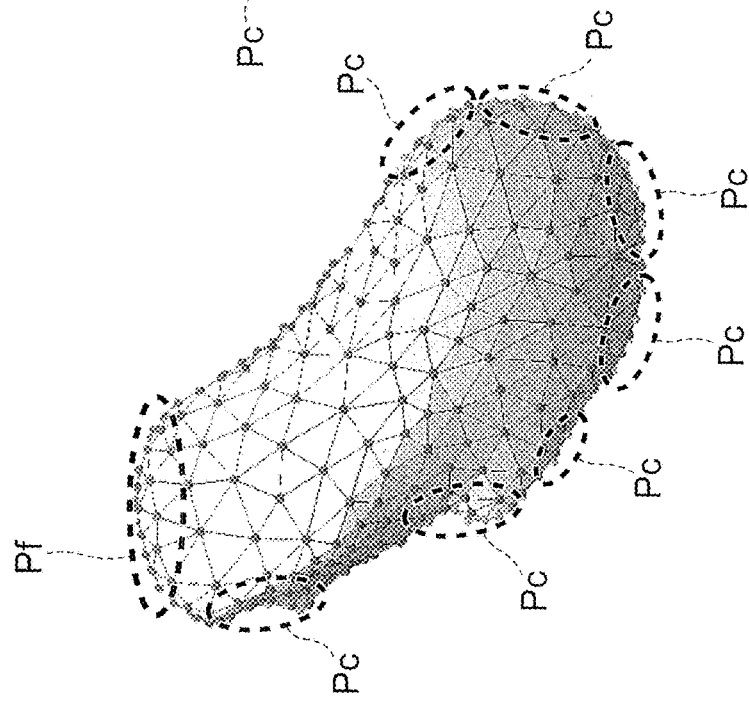
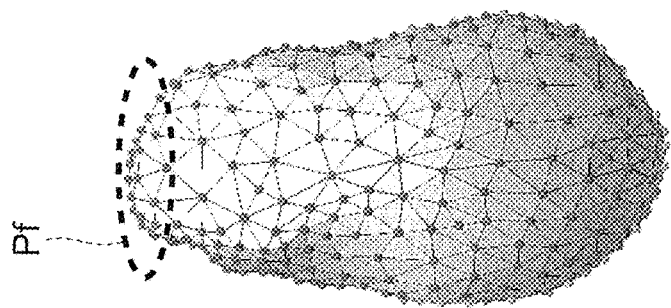
FIG.16A INITIAL SHAPE
FIG.16B DEFORMED SHAPE 1
FIG.16C DEFORMED SHAPE 2

DISPLAY OF LOCAL ERROR

ESTIMATION RESULT
OF DEFORMED SHAPE 1

INITIAL SHAPE

FIG.18C
DISPLAY OF LOCAL ERROR
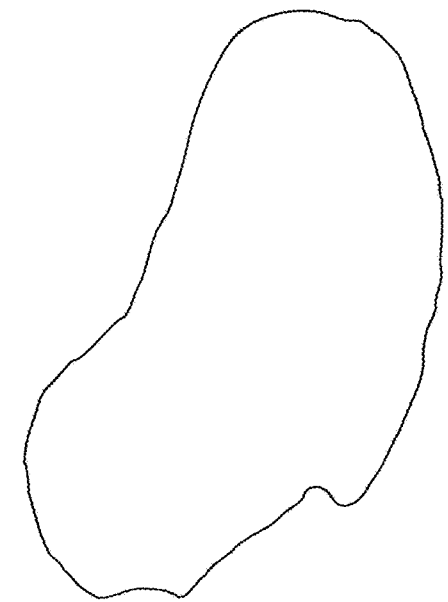
FIG.18B
ESTIMATION RESULT
OF DEFORMED SHAPE 2
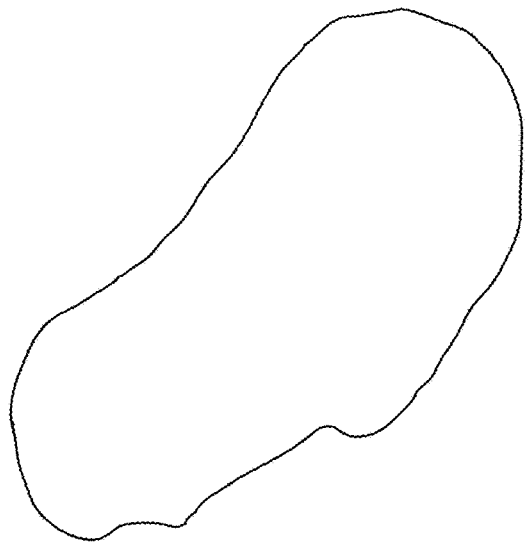
FIG.18A
INITIAL SHAPE

INFORMATION PROCESSING DEVICE, INFORMATION PROCESSING METHOD AND NON-TRANSITORY COMPUTER READABLE MEDIUM

TECHNICAL FIELD

The present invention relates to an information processing device, an information processing method and a program.

BACKGROUND ART

In recent years, surgery using an endoscope for reducing patient's strain has been rapidly increasing in number. On the other hand, surgery using an endoscope has a limited view; accordingly, strain on an operator is increased. Therefore, research and development of a surgery assistance system for assisting a grasp of a sense of depth of an organ or a degree of deformation of an organ are in progress.

For example, in Non-Patent Document 1, a method for expressing an internal structure of an organ by deforming a mesh model constructed from CT (Computed Tomography) data by use of local displacement in each point on an organ obtained from operative field images captured from multiple views (so-called stereo images) has been proposed.

CITATION LIST

Non-Patent Literature

Non-Patent Document 1

N. Haouchine, J. Dequidt, I. Peterlik, E. Kerrien, M. O. Berger, and S. Cotin, "Image-guided simulation of heterogeneous tissue deformation for augmented reality during hepatic surgery", International Symposium on Mixed and Augmented Reality (ISMAR), pp. 199-208, 2013.

SUMMARY OF INVENTION

Technical Problem

However, the method proposed in Non-Patent Document 1 has, since the local displacement is calculated by matching between multidimensional feature amounts, a disadvantage of impossibility of detecting feature points in a region where changes in pixel values are small. Moreover, the method proposed in Non-Patent Document 1 has, since the local displacement is calculated by a local matching method, a disadvantage that the calculation results greatly suffer from illumination changes or noises.

Therefore, an object of the present invention is to provide a method capable of estimating displacement in each region even in a case where effects of illumination changes or noises are included in a captured image.

Solution to Problem

The invention described in claim 1 provides an information processing device including a computation unit that determines an optimal solution of an external force to minimize a difference between a surface image of an elastic body captured from at least one direction and a rendering image as observed from the direction, the rendering image being generated from a three-dimensional model of the elastic body elastically deformed by the external force that has been unobserved.

The invention described in claim 2 provides the information processing device according to claim 1, wherein the computation unit determines the optimal solution of the external force based on an equation as follows:

$$f^* = \mathrm{argmin}_f \Sigma |I_t(x) - J_t(x)| + \lambda |f|_2$$

where f* represents an external force constraint to minimize an evaluation function; $I_t(x)$ represents a surface image of an elastic body with respect to time t and a pixel position x; $J_t(x)$ represents an image obtained by rendering a three-dimensional model on a two-dimensional image with respect to time t and a pixel position x; f represents magnitude of an external force; λ represents a coefficient; || represents an absolute value; and $||_1$ represents a one-dimensional norm.

The invention described in claim 3 provides an information processing device including: a storage unit that stores a surface image of an elastic body captured from at least one direction; a generation unit that generates a rendering image as observed from the direction, the rendering image being generated from a three-dimensional model of the elastic body elastically deformed by an unobserved external force; and an optimization unit that determines an optimal solution of the external force to minimize a difference between the surface image and the rendering image.

The invention described in claim 4 provides the information processing device according to claim 3, wherein the optimization unit determines the optimal solution of the external force based on an equation as follows:

$$f^* = \mathrm{argmin}_f \Sigma |I_t(x) - J_t(x)| + \lambda |f|_1$$

where f* represents an external force constraint to minimize an evaluation function; $I_t(x)$ represents a surface image of an elastic body with respect to time t and a pixel position x; $J_t(x)$ represents an image obtained by rendering a three-dimensional model on a two-dimensional image with respect to time t and a pixel position x; f represents magnitude of an external force; λ represents a coefficient; || represents an absolute value; and $||_1$ represents a one-dimensional norm.

The invention described in claim 5 provides the information processing device according to claim 1, further including: an expression unit that expresses the three-dimensional model elastically deformed based on the external force determined as the optimal solution.

The invention described in claim 6 provides the information processing device according to claim 1, wherein the surface image is a static image captured from only one direction.

The invention described in claim 7 provides the information processing device according to claim 1, wherein the surface image is a static image captured by a single image-capturing camera.

The invention described in claim 8 provides the information processing device according to claim 1, wherein a surface of the rendering image is provided with information of a surface of the elastic body.

The invention described in claim 9 provides the information processing device according to claim 1, wherein the optimal solution is determined to minimize a sum of differences between plural surface images of the elastic body captured from different directions and the individual plural rendering images corresponding to the respective different directions.

The invention described in claim 10 provides the information processing device according to claim 1, wherein, by using a sum of absolute values of the external forces as a constraint condition for the difference, the optimal solution is determined to minimize a sum of the constraint condition and the difference.

The invention described in claim 11 provides an information processing method including: a process of obtaining a surface image of an elastic body captured from at least one direction; a process of generating a rendering image as observed from the direction, the rendering image being generated from a three-dimensional model of the elastic body elastically deformed by an unobserved external force; and a process of determining an optimal solution of the external force to minimize a difference between the surface image and the rendering image.

The invention described in claim 12 provides a non-transitory computer readable medium storing a program causing a computer to execute: a process of obtaining a surface image of an elastic body captured from at least one direction; a process of generating a rendering image as observed from the direction, the rendering image being generated from a three-dimensional model of the elastic body elastically deformed by an unobserved external force; and a process of determining an optimal solution of the external force to minimize a difference between the surface image and the rendering image.

Advantageous Effects of Invention

According to the invention described in claim 1, it is possible to estimate displacement in each region even in the case where effects of illumination changes or noises are included in the captured image.

According to the invention described in claim 2, it is possible to estimate displacement in each region even in the case where effects of illumination changes or noises are included in the captured image.

According to the invention described in claim 3, it is possible to estimate displacement in each region even in the case where effects of illumination changes or noises are included in the captured image.

According to the invention described in claim 4, it is possible to estimate displacement in each region even in the case where effects of illumination changes or noises are included in the captured image.

According to the invention described in claim 5, it is possible to visually confirm the elastically-deformed three-dimensional model.

According to the invention described in claim 6, it is possible to simplify a device configuration used for observation of the elastic body.

According to the invention described in claim 7, it is possible to simplify a device configuration used for observation of the elastic body.

According to the invention described in claim 8, by using information of a surface of the elastic body, it is possible to increase estimation accuracy of displacement even in the case where only an image of a part of the elastic body is available.

According to the invention described in claim 9, by using information of plural images captured from different directions, it is possible to increase estimation accuracy of displacement even in the case where only an image of a part of the elastic body is available.

According to the invention described in claim 10, it is possible to increase estimation accuracy as compared to the case without using any constraint condition.

According to the invention of claim 11, it is possible to estimate displacement of each region even in a case where effects of illumination changes or noises are included in a captured image.

According to the invention of claim 12, it is possible to estimate displacement of each region even in a case where effects of illumination changes or noises are included in a captured image.

BRIEF DESCRIPTION OF DRAWINGS

FIGS. 7A and 7B show diagrams illustrating a positional relationship between a fixed point Pf and control points Pc: FIG. 7A is a diagram observing an x-z plane; and FIG. 7B is a diagram observing a y-z plane;

FIGS. 8A and 8B show diagrams illustrating a relationship between a fixed point Pf and an manipulation point Pa that are used in Experiment 1: FIG. 8A is a diagram showing an elastic body before deformation; and FIG. 8B is a diagram showing the elastic body after deformation;

FIG. 10A is a diagram showing the elastic body before deformation; and FIG. 10B is a diagram showing the elastic body after deformation;

FIGS. 15A-15C show diagrams of camera images of a piece of a pig's liver used in an experiment: FIG. 15A depicts an initial shape before an external force is applied; FIG. 15B depicts a deformed shape 1 after being deformed by an external force; and FIG. 15C depicts a deformed shape 2 after further being deformed by an external force;

FIGS. 16A-16C show diagrams of finite element models corresponding to the respective initial shape, deformed shape 1 and deformed shape 2: FIG. 16A shows the initial shape; FIG. 16B shows the deformed shape 1; and FIG. 16C shows the deformed shape 2;

FIG. 17A shows the initial shape as an input shape; FIG. 17B shows the deformed shape 1 estimated from an external force constraint; and FIG. 17C is a display in which the local errors are mapped into a Ground truth shape; and FIGS. 18A-18C show diagrams illustrating shape errors resulting from estimation of the deformed shape 2 using the deformed shape 1 as an input: FIG. 18A shows the deformed shape 1 as an input shape; FIG. 18B shows the deformed shape 2 estimated from an external force constraint; and FIG. 18C is a display in which the local errors are mapped into a Ground truth shape.

DESCRIPTION OF EMBODIMENTS

Hereinafter, with reference to attached drawings, exemplary embodiments according to the present invention will be described in detail.
<Concept Image>

Figure 1:
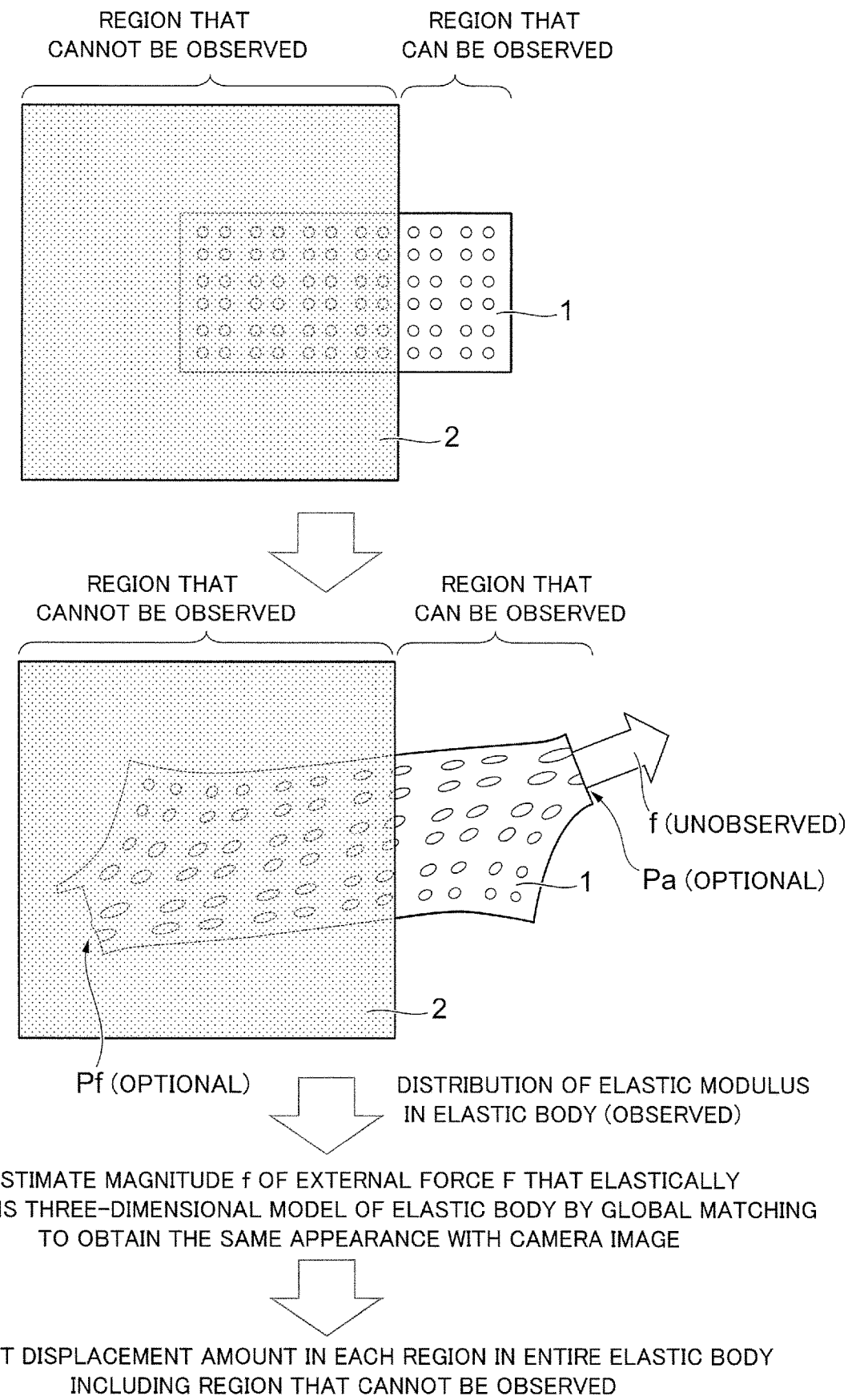
FIG. 1 is a diagram illustrating a concept image of an estimation method adopted in an exemplary embodiment.

FIG. 1 is a diagram illustrating a concept image of an estimation method adopted in an exemplary embodiment to be described later.

In the exemplary embodiment to be described later, a case where the entirety of an elastic body 1 cannot be observed (in other words, a case where there are regions that can be observed and regions that cannot be observed) is regarded as a precondition, and even in a case where only a partial observation image is available, a method for estimating a displacement amount in each region in the entire elastic body will be described.

More specifically, the estimation method in the exemplary embodiment adopts, when a partial observation image of the elastic body 1 elastically deformed by an external force F, a magnitude f of which is unobserved, is provided as an input, a method for estimating displacement in each regions of the entire elastic body by estimating the magnitude f of the external force F that deforms a three-dimensional model corresponding to the elastic body 1 to approximate thereof to the partial image.

Note that the estimation method in the exemplary embodiment differs from existing methods in the point that a degree of similarity between the three-dimensional model deformed by the estimated external force F (specifically, a rendering image) and the observation image of the elastic body 1 is increased, not by matching of the local feature points, but by estimating the magnitude f of the optimum external force F while globally evaluating information of the surface of the elastic body 1, such as brightness, to thereby specify the displacement amount in each region of the entire elastic body as a result.

Incidentally, in the exemplary embodiment to be described later, distribution of the elastic modulus in the elastic body 1 is regarded to be observed. For example, distribution of the elastic modulus in the elastic body 1 is regarded to be uniform (even). However, when detailed distribution of the elastic modulus in the elastic body 1 is given in advance (for example, when there has been measurement data or the distribution has been obtained by the estimation processing), the information is used. Since being "distribution", it is sufficient that relative positional relationships among the elastic moduli are observed, and the numerical values themselves may be unobserved. For example, as long as relatively stiff regions and soft regions are identified, specific numerical values may be left unobserved.

By the way, it does not matter whether a position where the external force F to deform the elastic body 1 is applied (namely, a position of an manipulation point Pa) is observed or unobserved. In the example of FIG. 1, the position of the manipulation point Pa exists in a region that can be observed; however, the position of the manipulation point Pa may also exist in a region that cannot be observed. Moreover, there is no limit on the number of manipulation points Pa; accordingly, there may be one or plural manipulation points Pa. Moreover, the manipulation points Pa may be provided on the entire surface of the elastic body 1. However, in terms of reducing the calculation amount, it is desirable that the number of manipulation points Pa is small, and the positions thereof are identified in advance.

It does not matter whether a position that constrains movement of the elastic body 1 (namely, a position of a fixed point N) is observed or unobserved. Algorithmically, it is desirable that the position of the fixed point Pf is observed; however, even if the position is unobserved, shift processing may be combined. In the example of FIG. 1, the position of the fixed point Pf exists in a region that cannot be observed; however, the position of the fixed point Pf may exist in a region that can be observed. Moreover, there is no limit on the number of fixed points Pf; accordingly, there may be one or plural fixed points Pf. Note that, when the elastic body 1 is an organ, the position of the fixed point Pf is observed.

The more the observed pieces of information, the higher the estimation accuracy becomes in general, and therefore, the calculation time required for estimation is reduced.

In FIG. 1, to describe the region that can be observed and the region that cannot be observed, the state in which a part of the elastic body 1 is covered with a shield 2 is shown; however, this does not mean that a part of the elastic body 1 is necessarily covered with the shield 2. For example, when the elastic body 1 is observed from only one direction, a region included in an observation field is a region that can be observed, and a region not included in the observation field is a region that cannot be observed. Consequently, a region which is an unobserved region of the elastic body 1 from the direction for observing (for example, a reverse side or a back surface side) is an example of the region that cannot be observed.

Terms

The elastic modulus in the exemplary embodiment includes: Young's modulus E representing stiffness in a pressing direction or a pulling direction; a stiffness modulus G representing stiffness in a shear direction; Poisson's ratio v; a volume elastic modulus K; and the like, and, in the exemplary embodiment to be described later, it is assumed that the elastic modulus is Young's modulus.

In the exemplary embodiment, the elastic body 1 refers to a substance having a property of, while generating distortion (being deformed) by the action of an external force F, returning to an original dimension when application of the external force F is stopped. In the exemplary embodiment, an elastic body represented by approximately using Hooke's law, such as, for example, various kinds of organs in a tissue from a living body, is assumed.
<System Configuration>

Figure 2:
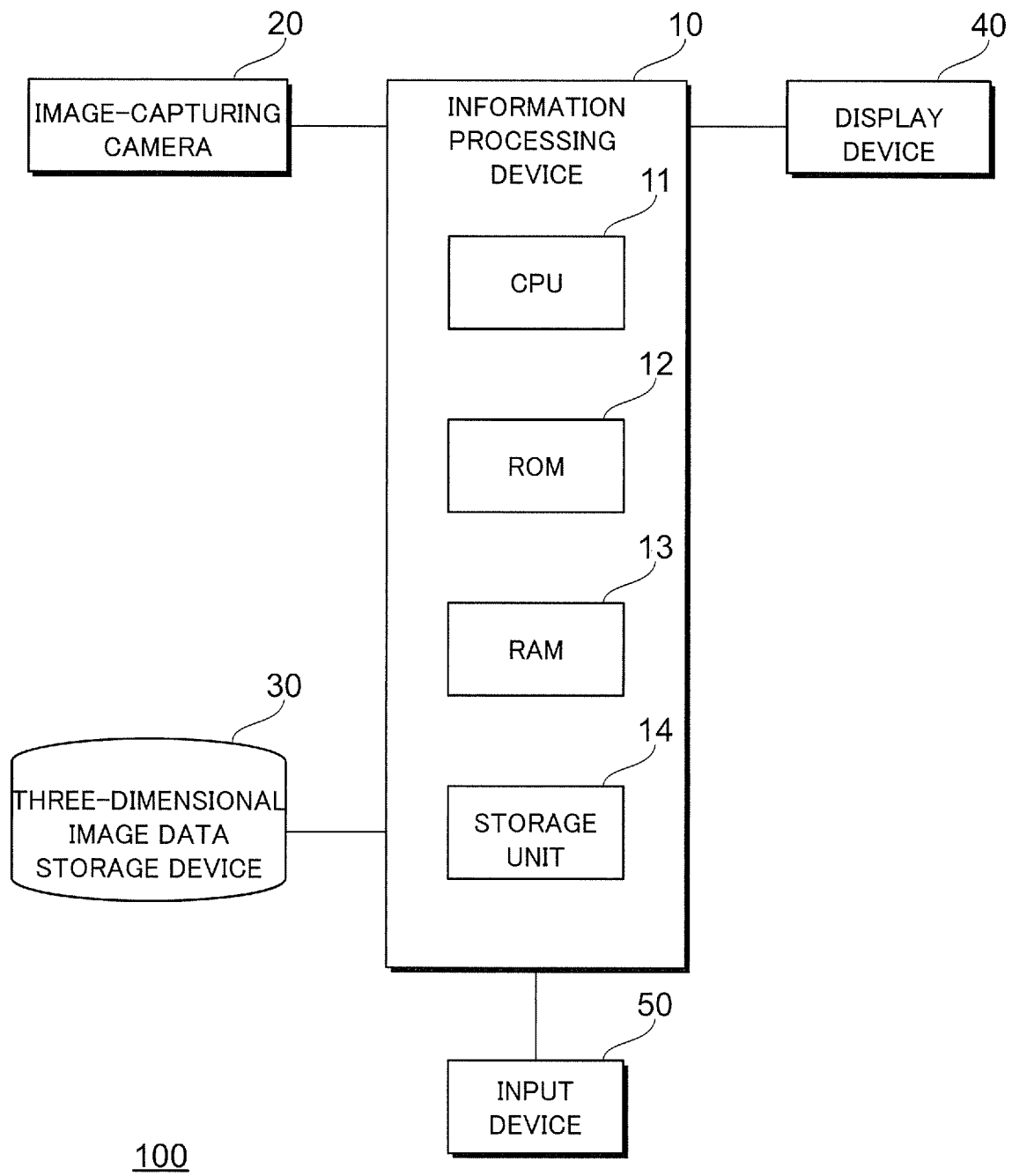
FIG. 2 is a diagram showing a configuration example of hardware in an information processing system.

FIG. 2 is a diagram showing a configuration example of hardware in an information processing system 100.

The information processing system 100 includes: an information processing device 10 that executes arithmetic processing for estimating a displacement amount in each region constituting the elastic body 1 (refer to FIG. 1); at least one image-capturing camera 20 used for capturing images of the elastic body 1; a three-dimensional image data storage device 30 that stores three-dimensional image data (volume data) used for generating a mesh model of the elastic body 1; a display device 40 used for displaying a mesh model deformed based on an estimation result; and an input device 50 configured with a mouse, a pointing device and the like operated by a user.

The information processing device 10 is a so-called computer and configured with: a CPU (Central Processing Unit) 11 that executes programs; a ROM (Read Only Memory) 12 that stores programs, such as BIOS (Basic Input/Output System) or firmware, or data; a RAM (Random Access Memory) 13 that provides programs with work areas; and a storage unit 14 that stores image data to be subjected to processing. The storage unit 14 is a storage device, such as a hard disk device or a semiconductor memory. The functions accomplished through execution of programs by the CPU 11 will be described later.

The image-capturing camera 20 is an image-capturing device used for observation of the elastic body 1. The image-capturing camera 20 may be an image-capturing device suitable for observation of the elastic body 1. For example, as the image-capturing camera 20, an infrared camera, an endoscopic camera, an ultrasonic imaging device, a photoacoustic imaging device, an X-ray inspection device or the like is used. Note that an imaging element of the endoscopic camera may be a CCD (Charge Coupled Device) or a CMOS (Complementary MOS).

In the exemplary embodiment, a single monocular image-capturing camera 20 is used to output a static image (a surface image) of the elastic body 1 captured from one direction.

The three-dimensional image data storage device 30 is configured with a large-capacity hard disk device or the like that stores, as three-dimensional image data, an image reconfigured (a reconfiguration image) by accumulating pieces of tomographic image data obtained by taking tomography of the elastic body 1.

The three-dimensional image data storage device 30 can, not only be directly connected to the information processing device 10, but also exist on a network as a server or a network storage. Here, for obtaining the tomographic image data, for example, CT (Computed Tomography), PET (Positron Emission Tomography), MRI or the like is used.

The display device 40 is configured with, for example, a liquid crystal display. The liquid crystal display is configured with a liquid crystal panel, a backlight, and so forth. Note that the display device 40 may be an organic EL (ElectroLuminescence) display or the like.

Figure 3:
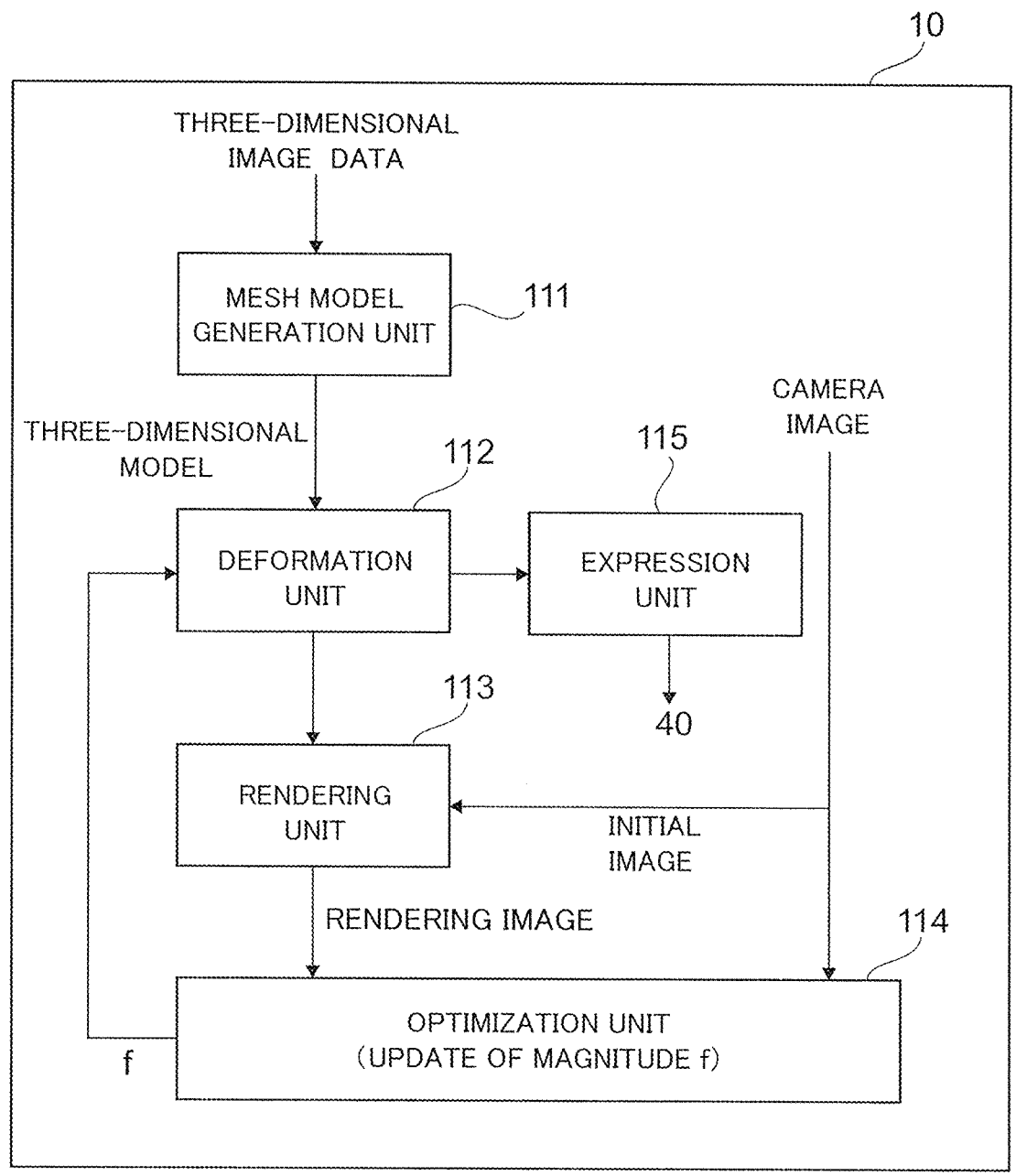
FIG. 3 is a diagram illustrating a functional configuration example accomplished through execution of a computer program.

FIG. 3 is a diagram illustrating a functional configuration example accomplished through execution of computer programs by the CPU 11. Here, an input/output relationship of the functional configuration shown in FIG. 3 is an example of the information processing method.

The information processing device 10 from the standpoint of processing functions includes: a mesh model generation unit 111 that generates a three-dimensional mesh model (a three-dimensional model); a deformation unit 112 that deforms the three-dimensional model based on Hooke's law; a rendering unit 113 that generates a rendering image by rendering the deformed three-dimensional model; an optimization unit 114 that determines an external force F to minimize a difference between the rendering image and a camera image as an optimal solution; and an expression unit 115 that outputs a three-dimensional matrix deformed by the external force F and the displacement amount in each region to the display device 40. These functional units are an example of "a computation unit" in claims.

The mesh model generation unit 111 is a functional unit that takes in the three-dimensional image data of the elastic body 1 regarded as an observation object from the three-dimensional image data storage device 30, and then generates a mesh model, which is an aggregation of simple shape elements, from the three-dimensional image data provided as a continuous body. The mesh model here is an example of the three-dimensional model, and a minimum element thereof is expressed by a cube or a tetrahedron (triangular pyramid). In the following, description will be given on the assumption that the minimum element is a tetrahedron.

Figure 4:
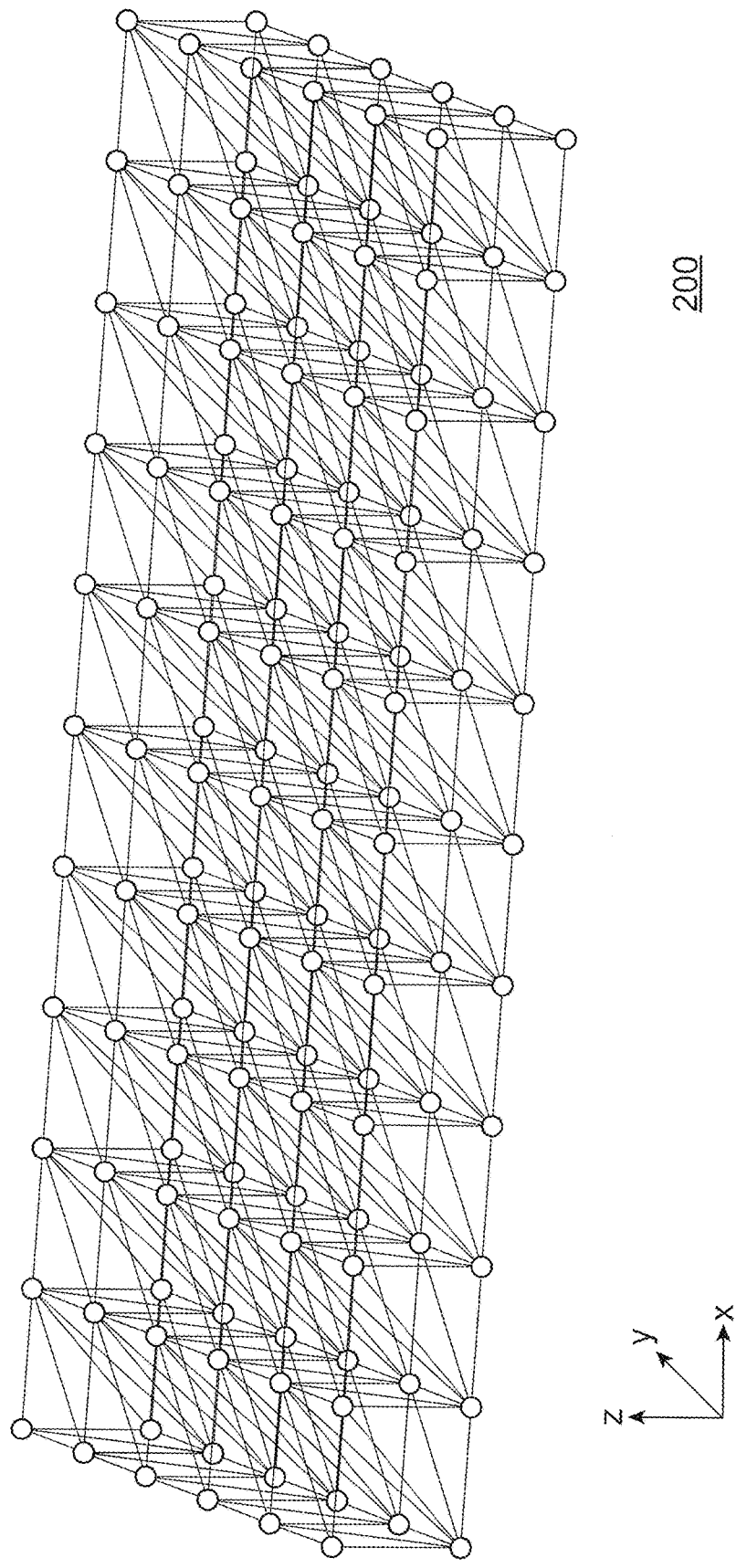
FIG. 4 is a diagram showing an example of a mesh model expressing an elastic body by a mesh structure.

FIG. 4 is a diagram showing an example of a mesh model 200 expressing the elastic body 1 by a mesh structure. FIG. 4 depicts the mesh model 200 before the external force F is applied to the manipulation point Pa (refer to FIG. 1). Circles in the figure depict vertexes of the minimum elements, namely, nodes.

Let us return to description of FIG. 3. The deformation unit 112 is a functional unit that executes an operation to elastically deform the three-dimensional model in accordance with the magnitude f of the external force F that is successively updated. The deformation unit 112 calculates the displacement amount of each individual node constituting the three-dimensional model by use of the magnitude f provided by the optimization unit 114 and an observed elastic modulus (by Hooke's law). By calculation of the displacement amount of each individual node, the shape of the three-dimensional model that has been elastically deformed is determined. Note that Hooke's law is assumed to be broadly interpreted, and, for calculation of elastic deformation, for example, the Finite Element Method (FEM) is used.

By Hooke's law, based on Equation 1, which is modification of equation of equilibrium of force (f=Ku) where a total stiffness matrix is K, it is possible to calculate a displacement amount u in each node constituting the three-dimensional model.

$$u = K^{-1} f = Lf \qquad \text{Equation 1}$$

Note that L means an inverse matrix ($K^{-1}$) of the total stiffness matrix K.

Here, it is assumed that distribution of Young's modulus in the elastic body 1 is observed, and the magnitude f (the vector) of the external force F applied to the elastic body 1 is a variable. Note that the initial value of the magnitude f is 0 (zero).

Since Young's modulus is an intensional parameter of the total stiffness matrix K, it is possible to calculate the total stiffness matrix K and the inverse matrix L thereof from observed Young's modulus. In other words, the inverse matrix L in Expression 1 is observed.

The rendering unit 113 is a functional unit that generates a two-dimensional image formed by rendering surface information of the elastic body 1 on the three-dimensional model (a rendering image).

The rendering unit 113 executes, before the optimization processing is started, calibration processing that corrects orientation and dimension of the three-dimensional model to obtain a rendering image that matches with a camera image before the external force F is applied to the elastic body 1 (initial image) as much as possible. In the calibration processing, as a result of image matching, the rendering unit 113 calibrates the orientation and dimension of the three-dimensional model by use of information related to a direction for observing the elastic body 1 and so forth.

The rendering unit 113 generates a rendering image formed by at least providing shadows generated by asperities or undulations appearing on the surface of the elastic body 1 (namely, brightness information) to the surface of the three-dimensional model after the calibration processing is finished. However, the shadows are not essential.

Here, it is desirable that, in the rendering image, information automatically available from the camera image or existing knowledge, such as colors, patterns, structural features and borders, is preferably included. The more the pieces of information are included in the rendering image, the more the accuracy of global matching executed in the optimization unit 114 is improved.

The optimization unit 114 is a functional unit that estimates the optimal solution of the magnitude f of the external force F deforming the three-dimensional model to minimize the difference obtained by global matching between an appearance in the camera image and an appearance in the rendering image.

The optimization unit 114 here estimates the optimal solution by use of an evaluation function E defined by the following equation (Equation 2).

$$E=\int \mathrm{dist}(I_t(x),J_t(x))dx \qquad \text{Equation 2}$$

Here, $I_t(x)$ is the camera image and $J_t(x)$ is the rendering image. Note that the index t represents time, and the variable x provides a pixel position in the rendering image.

Specifically, the optimization unit 114 determines an external force constraint that minimizes the evaluation function E (that is, providing deformation most approximate to the observation result) by an equation of the minimization problem provided by the following equation (Equation 3).

$$f^*=\mathrm{argmin}_f \Sigma |I_t(x)-J_t(x)|+\lambda |f|_1 \qquad \text{Equation 3}$$

Here, the first term represents a difference between individual pieces of information included in the image (for example, a difference between brightness values at the corresponding pixel positions), and the second term represents a regular term of 1 norm. Then, λ is weight with respect to the regular term.

When there are plural external forces F, 1 norm is provided as a sum of absolute values of individual magnitudes f. The second term here is an example of "a constraint condition" in claims.

In general, combinations of deformation of the elastic body 1 obtained from a single camera image and the magnitude f providing the external force constraint f* that generates the similar deformation exist beyond number.

Figure 5:
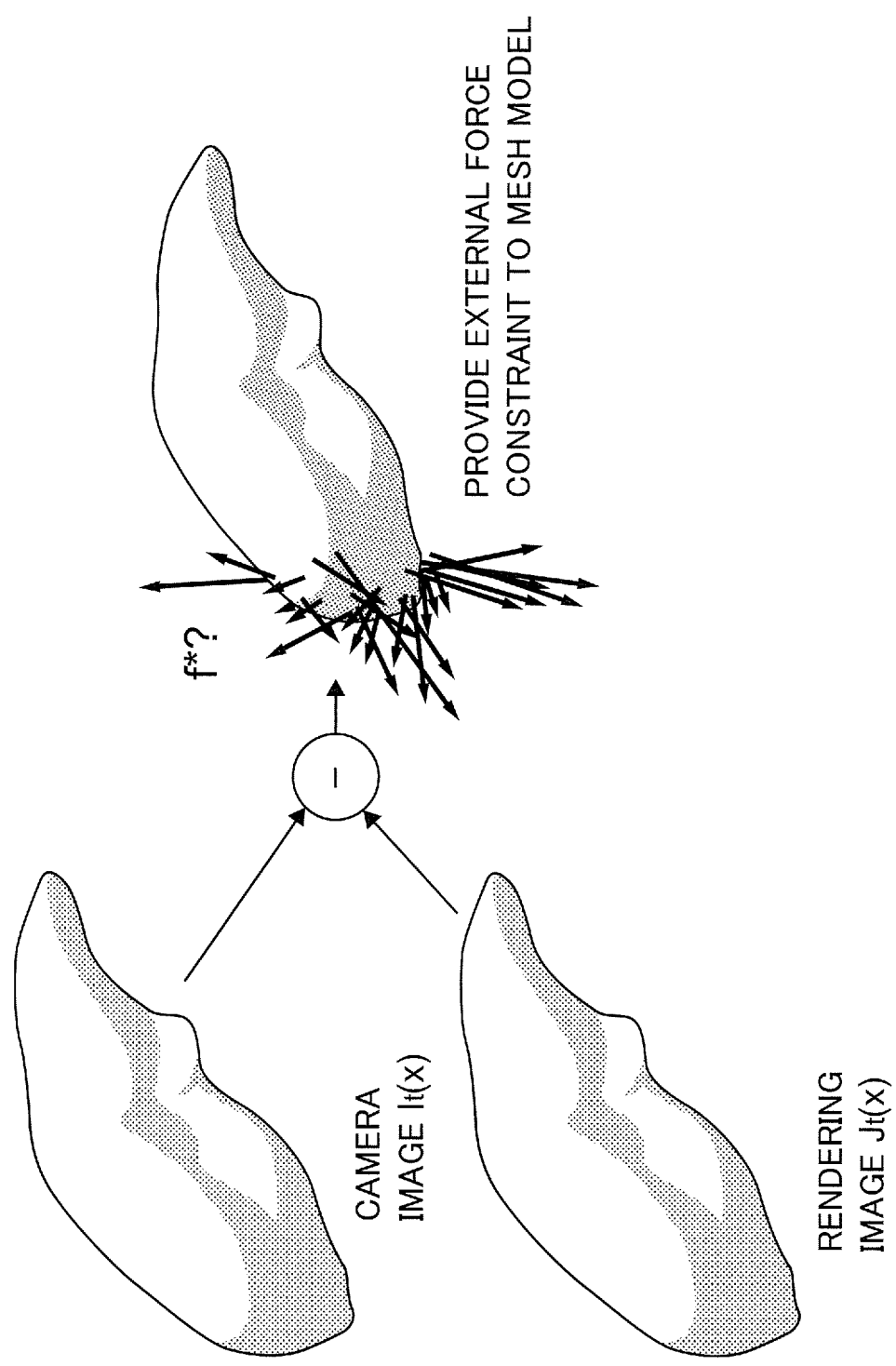
FIG. 5 is a diagram illustrating candidates of an external force constraint estimated when a regular term is not used.

FIG. 5 is a diagram illustrating candidates of combinations of magnitudes f providing external force constraints f* estimated when the regular term is not used. Through introduction of the regular term, it becomes possible to derive a solution capable of reducing the number of external forces F to be applied and the magnitudes f thereof.

Figure 6:
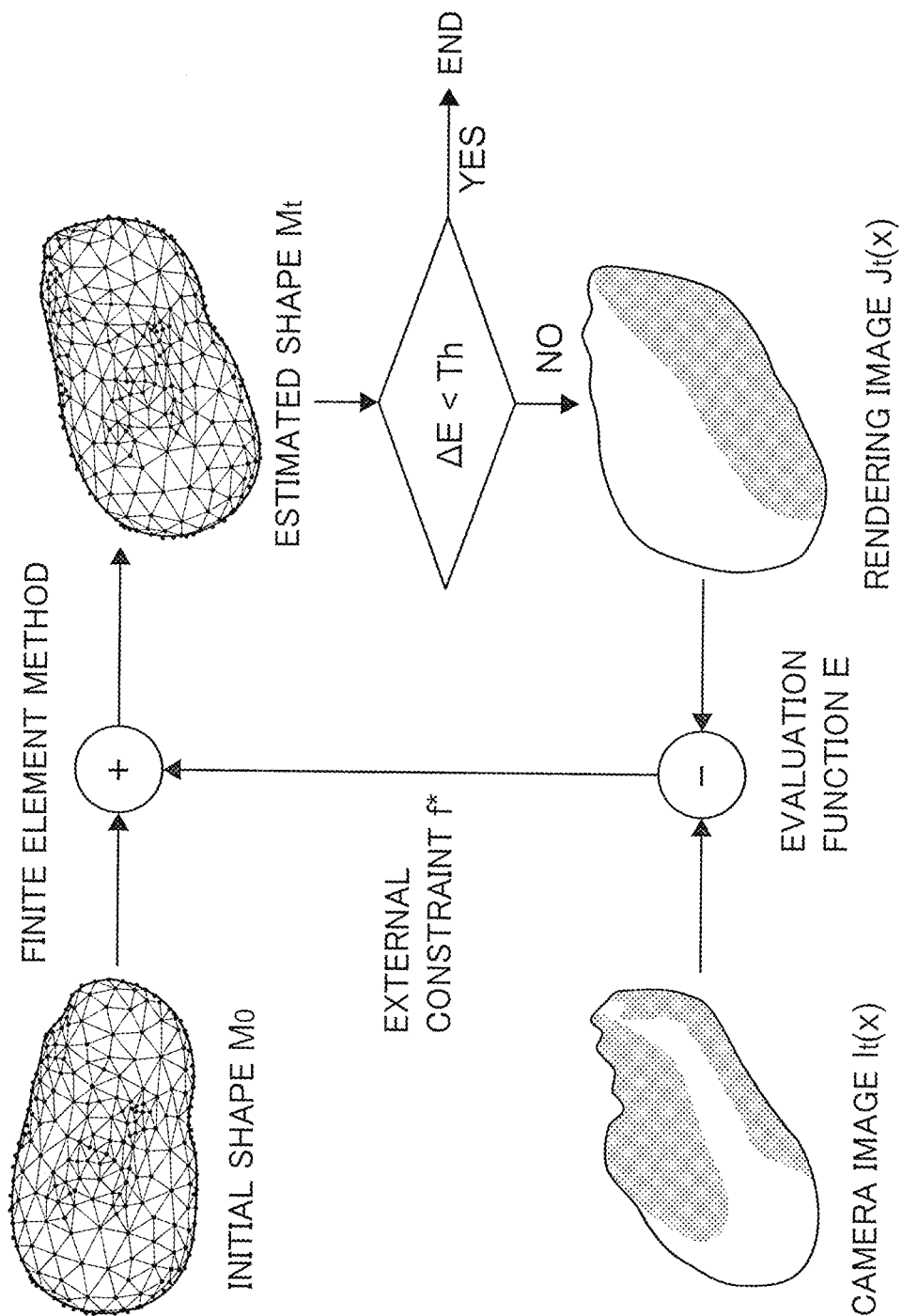
FIG. 6 is a diagram showing a flow of estimation processing by an optimization unit.

FIG. 6 is a diagram showing a flow of the estimation processing by the optimization unit 114. As shown in FIG. 6, the external force constraint f* updated to minimize the evaluation function E is applied to an initial shape $M_0$ of the three-dimensional model, and a search of an optimal solution of the estimated shape $M_t$ deformed by the finite element method at the time t is continued until the function E becomes smaller than an evaluation Th.

The optimization unit 114 updates the number and the magnitudes f of the external forces F until the optimal solution is obtained, and provides the updated information to the deformation unit 112 (refer to FIG. 3). The estimated shape $M_t$ of the three-dimensional model is obtained by the displacement amount u calculated by Equation 1 when the optimal solution is obtained.

In the exemplary embodiment, as a method of solving the optimization problem, Covariance Matrix Adaptation Evolution Strategy (CMA-ES) was used. However, as the method of solving the optimization problem, any other known methods may be used. For example, a gradient method, Monte Carlo method, simulated annealing, or the like may be used.

Let us return to description of FIG. 3. The expression unit 115 is a functional unit that displays the estimated shape of the three-dimensional model on the display device 40 (refer to FIG. 2). The expression unit 115 may perform expression by providing information, such as the brightness information, to the surface of the three-dimensional model.

The expression unit 115 may display the displacement amount in each region calculated for the magnitude f of the external force F determined as the optimal solution by use of colors or brightness as needed.

By the display, a user can visually recognize an entire appearance of the elastic body 1 including the regions that cannot be observed. Moreover, the user can recognize deformation of the internal structure (for example, positions of blood vessels or tumors) of the elastic body 1.

<Verification by Simulation Experiment>

Hereinafter, description will be given of a verification result of accuracy of the estimated shape $M_t$ (refer to FIG. 6) estimated from the rendering image generated from the mesh model 200 (refer to FIG. 4) generated with respect to the elastic body 1 and the camera image observing a part of the elastic body 1.

<Verification Condition>

A theoretical external force constraint Pc can be provided to all nodes of the mesh model 200 (refer to FIG. 4).

However, in the mesh model 200 (or 200A) having N nodes, if there is a possibility that all the nodes are provided with the external force constraints f*, calculation to determine the estimated shape $M_t$ becomes a parameter optimization problem of 3×N dimension; accordingly, there is a fear of impossibility of solving within actual time due to an enormous calculation amount.

Therefore, in a simulation experiment, in consideration of a balance between the estimation accuracy and the calculation amount, the number of parameters is reduced.

Specifically, the external force F applied to the elastic body 1 was limited to a tensile force and the positions and numbers of nodes to which the external force F was applied were also limited, and thereby the dimension of the external force constraints f* was lowered. Note that the manipulation point Pa where the tensile force was applied was assumed to exist at a region sufficiently separated from the fixed point Pf.

Hereinafter, a node having a possibility of serving as the manipulation point Pa (a candidate point) is referred to as a control point Pc, and a predetermined number of such nodes are set at positions satisfying the following conditions.

(1) Select a node at a farthest distance from a position of the center of gravity of the fixed point Pf as the control point Pc.

(2) Exclude a node existing within a certain range from another selected control point Pc from a search range of the control point Pc.

(3) Repeat conditions (1) and (2) until the control points Pc of the predetermined number are selected.

FIGS. 7A and 7B show diagrams illustrating positional relationships between the control points Pc and the fixed point Pf determined by applying the aforementioned conditions (1) to (3). FIGS. 7A and 7B show the positional relationships between the fixed point Pf and the control points Pc when the initial shape of the elastic body 1 is a spherical shape and the number of the control points Pc is "6".

In FIG. 7A, a state is shown, in which, when one fixed point Pf is provided to the right end in the figure, six control points Pc are disposed at the left end in the figure. Note that, since FIG. 7A is a diagram including the fixed point Pf in view, only three of the six control points Pc can be seen. FIG. 7B is a diagram viewing an opposite side of the fixed point Pf, where the six control points Pc are disposed.

The optimization unit 114 (refer to FIG. 3) assumes that one or plural of these six control points Pc are the manipulation points Pa and executes the optimization processing on the magnitude f of the external force F.

In the following Experiments 1 and 2, the external force F is applied to the elastic body 1 having an observed initial shape to forcibly move the center of gravity of the manipulation point Pa by a certain distance (a correct solution value), and camera images captured by the image-capturing camera 20 at that time are provided to the information processing device 10 to estimate the displacement amount in each region of the elastic body 1, to thereby quantitatively evaluate the accuracy of the estimation result.

On that occasion, the optimization unit 114 expressed the coordinates of the elastic body 1 and the coordinates of the image-capturing camera 20 regarding the center of the space as the origin.

Moreover, in each experiment, the image-capturing camera 20 is positioned in the −y direction side with respect to the elastic body 1 and captures images of the surface of the elastic body 1 in the +y direction. Consequently, by the image-capturing camera 20, as shown in FIG. 7A, a camera image including the fixed point Pf at the right end is obtained. Note that a position of a light source is assumed to be the same as the position of the image-capturing camera 20. However, the position of the light source may be different from the position of the image-capturing camera 20. But, since the position of the light source affects the orientation of shadows appearing in the camera image to be captured, it is assumed that the positional information of the light source is provided to the rendering unit 113 in advance.

Experiment 1

In Experiment 1, assuming a case of a single monocular image-capturing camera 20, effect of the value of the weight parameter $\lambda$ in Equation 3 on the estimation accuracy was investigated.

FIGS. 8A and 8B show diagrams illustrating a relationship between the fixed point Pf used in Experiment 1 and the manipulation point Pa. FIG. 8A shows the initial shape of the spherical elastic body 1 before the external force F is applied, and FIG. 8B shows the shape of the elastic body 1 after being deformed in the −x direction by application of the external force F. Note that, in FIGS. 8A and 8B, the nodes of the mesh model 200 (refer to FIG. 4) are depicted by being mapped into surface positions of the elastic body 1.

The number of nodes of the mesh model 200 corresponding to the spherical elastic body 1 used in Experiment 1 is 642, and the number of tetrahedron elements is 1280.

In Experiment 1, 15 nodes positioned at the right end in the figure were used as the fixed point Pf, and 15 nodes positioned at the left end in the figure were used as the manipulation point Pa.

As described above, in Experiment 1, the fixed point Pf is assumed to be observed and the number of corresponding control points Pc is assumed to be six.

Further, it was assumed that the distribution of Young's modulus inside the elastic body 1 was uniform and the absolute value was 1 MPa.

In Experiment 1, the spherical elastic body 1 shown in FIG. 8A was assumed as the initial shape, and 27 (=3×3×3) patterns of forcible displacements in total, that is, displacements of 0 mm, +25.6 mm and −25.6 mm in each of the x, y and z directions, were provided to the manipulation point Pa. Note that the radius of the elastic body 1 was assumed to be 64 mm.

FIG. 8B shows a shape when the manipulation point Pa of the elastic body 1 is forcibly displaced from the initial positions by 25.6 mm (the correct solution value) in the −x direction.

In Experiment 1, to verify the effects of the value of the parameter $\lambda$ in Equation 3 on the estimation accuracy, six values "0.0", "0.05", "0.1", "0.25", "0.5" and "1.0" were used.

Then, the camera image of the elastic body 1 taken by use of a single monocular image-capturing camera 20 was inputted to the information processing device 10, the magnitude f of the external force F providing deformation minimizing the evaluation function E to the mesh model 200 was estimated for each of the six patterns of the value of the parameter $\lambda$, and an average value of a root mean square error (RMSE) of the distance between nodes of the displacement amount and the correct solution value at that time was calculated.

However, in the CMA-ES used in the exemplary embodiment, optimization is executed by use of a random number; accordingly, the result is not constant in each estimation. Therefore, the estimation processing was executed five times in Experiment 1, and the result with the best evaluation value was regarded as the estimation result in each setting of the parameter $\lambda$.

In Table 1, the average values of the root mean square error (RMSE) (mm) of 27 patterns of estimation results obtained for six patterns of the value of the parameter $\lambda$ are shown.

TABLE 1

| | $\lambda$ | | | | | |
|---|---|---|---|---|---|---|
| | 0.0 | 0.05 | 0.1 | 0.25 | 0.5 | 1.0 |
| Average RMSE (mm) | 2.24 | 1.62 | 1.98 | 3.17 | 4.89 | 6.96 |

Figure 9:
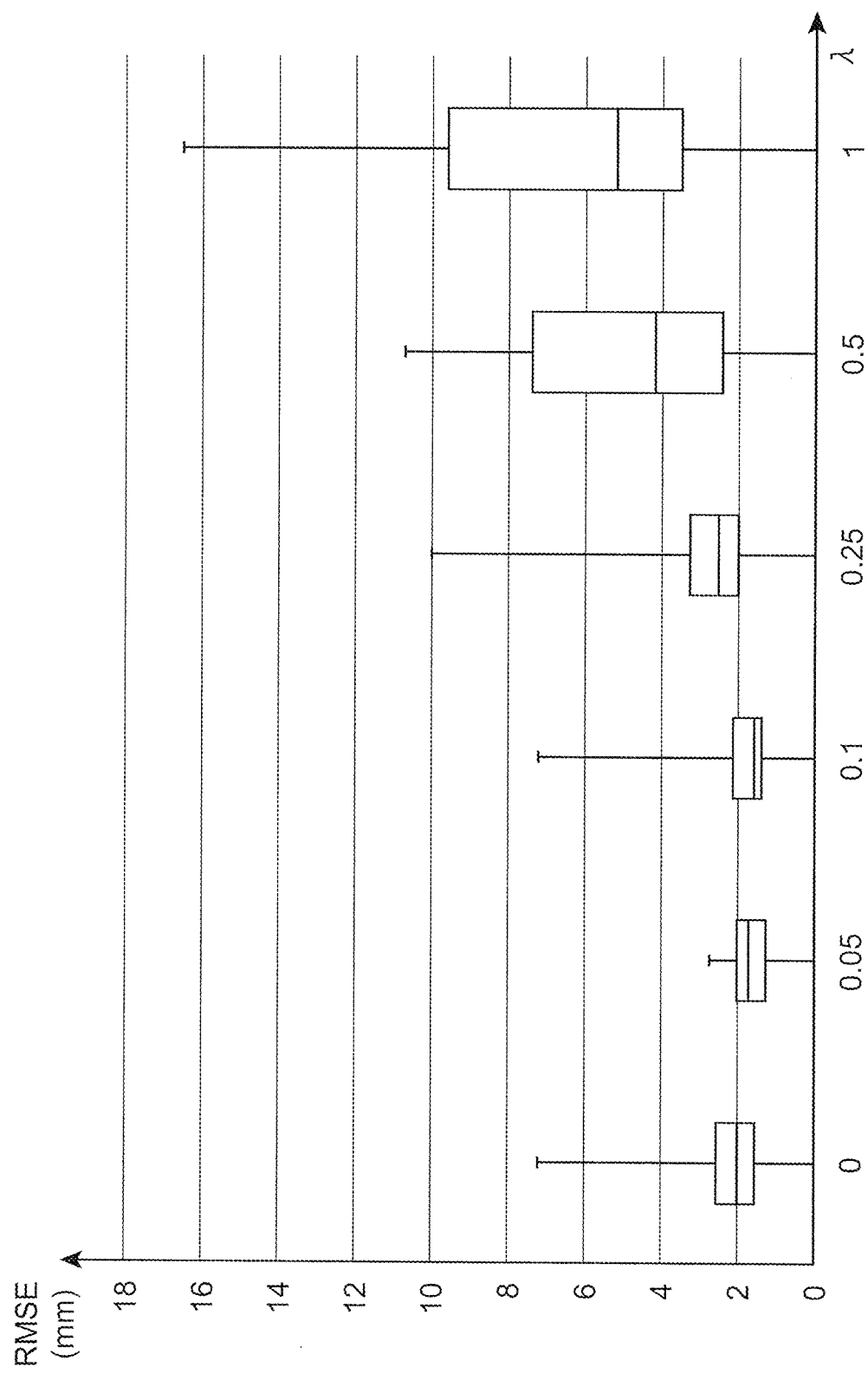
FIG. 9 is a chart showing a relationship between a parameter A and a root mean square error (RMSE) of an estimation result.

FIG. 9 is a chart showing a relationship between the parameter $\lambda$ and a root mean square error (RMSE) of the estimation result.

The horizontal axis in FIG. 9 represents the parameter $\lambda$, and the vertical axis represents the average value (mm) of the root mean square error of the 27 patterns of displacements. In FIG. 9, variations in the root mean square error are represented by a box-and-whisker plot separated by quartile points.

In the case of FIG. 9, the value $\lambda$=0.05 with the smallest error and the smallest distribution in the box-and-whisker plot can reduce the estimation error by the information processing device 10.

Experiment 2

In Experiment 2, direction dependency of the estimation accuracy, when the elastic body 1 was forcibly displaced in each of the x, y and z directions upon setting the parameter $\lambda$ in Equation 3 to 0.05, was verified.

In Experiment 2, in addition to the spherical elastic body 1 used in Experiment 1, a liver-shaped elastic body 1 was also evaluated.

Figure 10B:
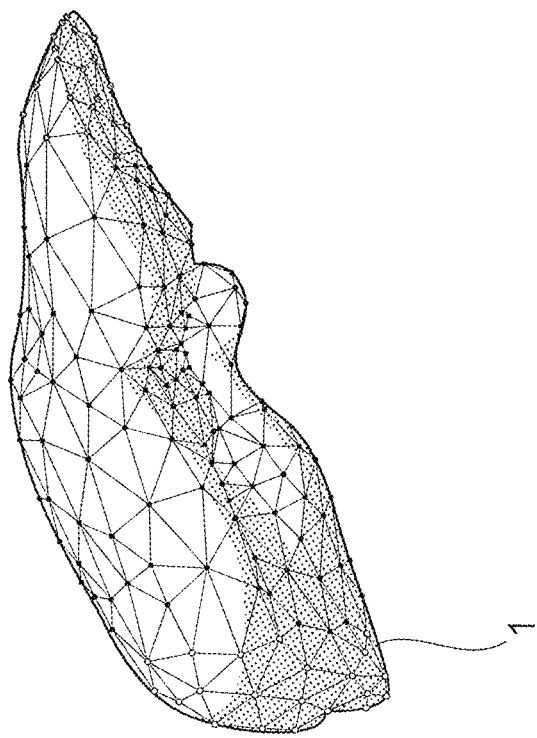
FIGS. 10A and 10B show diagrams illustrating a relationship between a fixed point Pf and an manipulation point Pa that are used in Experiment 2 related to a liver-shaped elastic body.
Figure 10A:
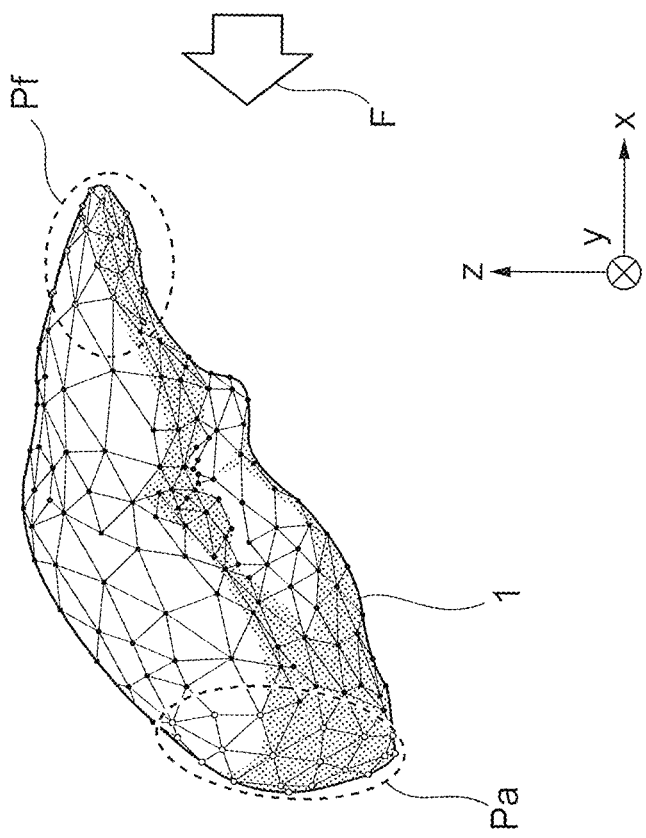

FIGS. 10A and 10B show diagrams illustrating a relationship between the fixed point Pf and the manipulation point Pa used in Experiment 2 related to the liver-shaped elastic body 1.

FIG. 10A shows the initial shape of the elastic body 1 before the external force F is applied, and FIG. 10B shows the shape of the elastic body 1 after being deformed in the −x direction by application of the external force F. Note that, in FIGS. 10A and 10B, the nodes of the mesh model 200 (refer to FIG. 4) are depicted by being mapped into surface positions of the elastic body 1.

The number of nodes of the mesh model 200 corresponding to the liver-shaped elastic body 1 used in Experiment 2 is 202, and the number of tetrahedron elements is 600.

In Experiment 2, as the fixed point Pf, 38 nodes positioned at the right end in the figure were used, and, as the manipulation point Pa, 41 nodes positioned at the left end in the figure were used.

Also, in Experiment 2, the fixed point Pf is assumed to be observed and the number of corresponding control points Pc is assumed to be six.

Further, it was assumed that the distribution of Young's modulus inside the elastic body 1 was uniform and the absolute value was 1 MPa.

In Experiment 2, forcible displacements provided to the manipulation point Pa were assumed to be 8 patterns of ±6.4 mm, ±12.8 mm, ±19.2 mm and ±25.6 mm in each of the x, y and z directions. Note that, when displacement was provided in one direction, for investigating dependency of accuracy in each direction, displacement components in other directions were set to 0. Consequently, experiments were conducted in 24 (=8+8+8) patterns in total. Note that it was assumed that the dimension of the elastic body 1 in the width direction (in the x direction in the figure) was 210 mm, the dimension in the depth direction (in the y direction in the figure) was 140 mm, and the dimension in the height direction (in the z direction in the figure) was 75 mm.

FIG. 10B shows a true shape when the external force F is applied to the manipulation point Pa provided by the 41 nodes to displace the elastic body 1 by 25.6 mm in the −x direction from the initial shape.

In Experiment 2, the parameter $\lambda$ in Equation 3 was set to 0.05 as described above, the camera image of the elastic body 1 taken by use of the single monocular image-capturing camera 20 was inputted to the information processing device 10, the magnitude f of the external force F providing deformation minimizing the evaluation function E to the mesh model 200A was estimated, and the root mean square error (RMSE) of the distance between nodes of the displacement amount at that time and the correct solution value was calculated for each node.

Figure 11:
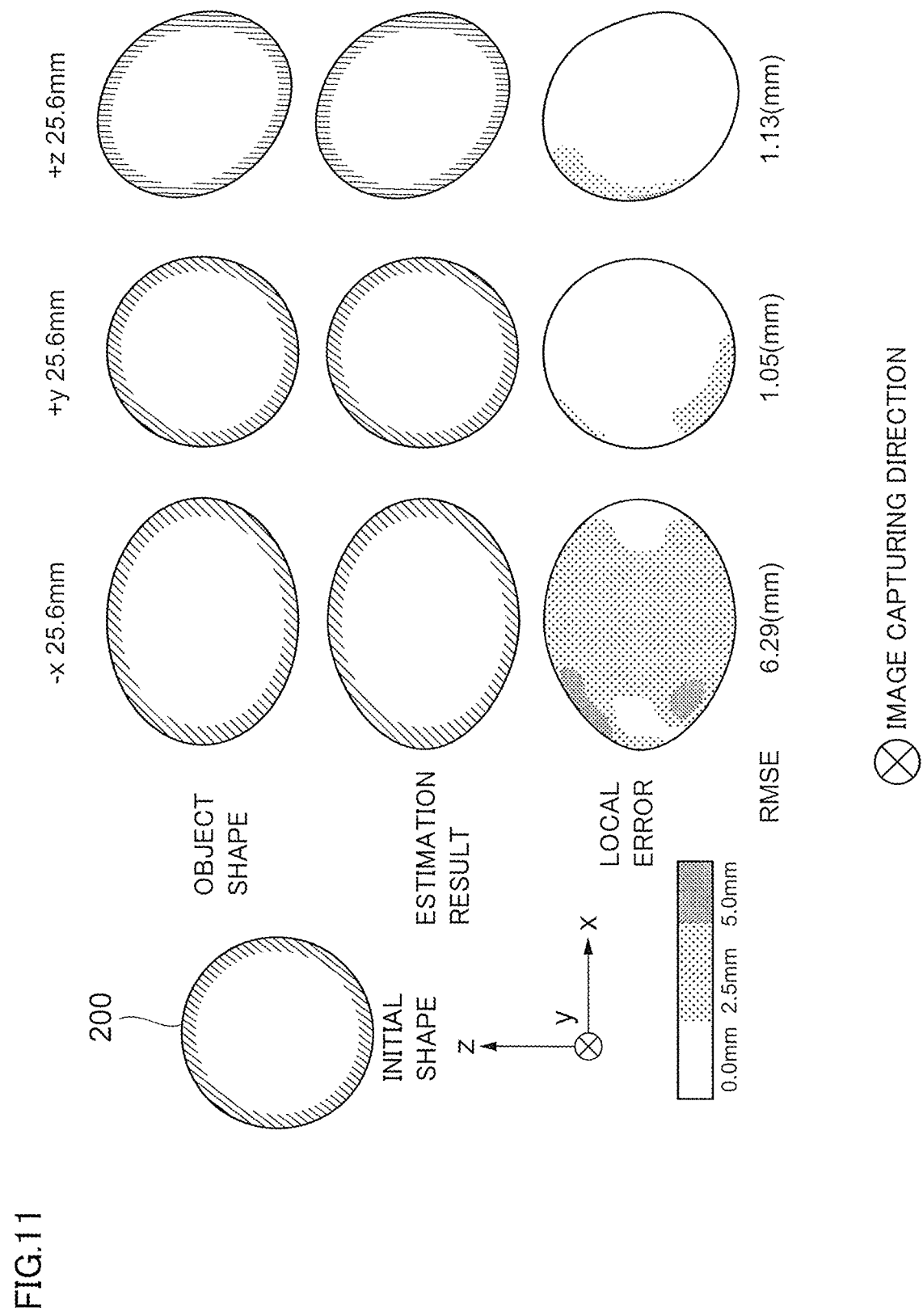
FIG. 11 is a diagram for illustrating positional relationships among local errors in a spherical mesh model forcibly displaced in each direction.
Figure 12:
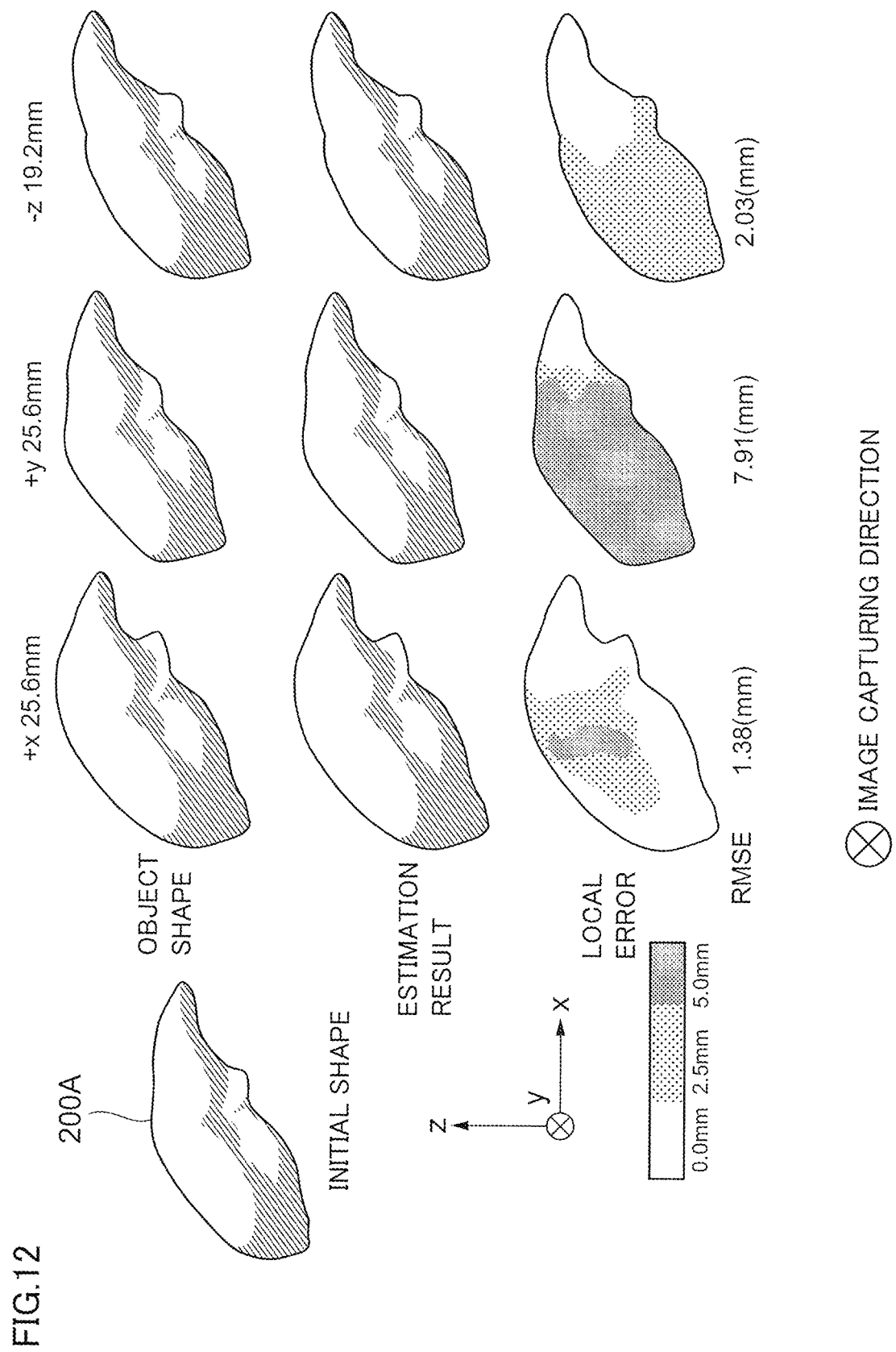
FIG. 12 is a diagram for illustrating positional relationships among local errors in a liver-shaped mesh model forcibly displaced in each direction.

FIG. 11 is a diagram for illustrating positional relationships among local errors in the spherical mesh model 200 forcibly displaced in respective directions. FIG. 12 is a diagram for illustrating positional relationships among local errors in a liver-shaped mesh model 200A forcibly displaced in respective directions.

In FIG. 11, relationships among the object shape (the true shape) when forcible displacement of −25.6 mm only in the x direction, +25.6 mm only in the y direction, or +25.6 mm only in the z direction is provided to the elastic body 1, the estimation result (the estimated shape of the mesh model 200) and the distribution of local errors are shown, whereas, in FIG. 12, relationships among the object shape (the true shape) when forcible displacement of +25.6 mm only in the x direction, +25.6 mm only in the y direction, or −19.2 mm only in the z direction is provided to the elastic body 1, the estimation result (the estimated shape of the mesh model 200) and the distribution of local errors are shown.

In FIGS. 11 and 12, a region where the error is 5 mm or more is represented by dark shading, a region where the error is 0 mm is represented by solid white, and a region of the intermediate error is represented by light shading.

In the examples in FIGS. 11 and 12, many local errors of 5 mm or more occur in the case where large forcible displacement is provided to the spherical elastic body 1 in the −x direction and in the case where large forcible displacement is provided to the liver-shaped elastic body 1 in the +y direction.

Figure 13:
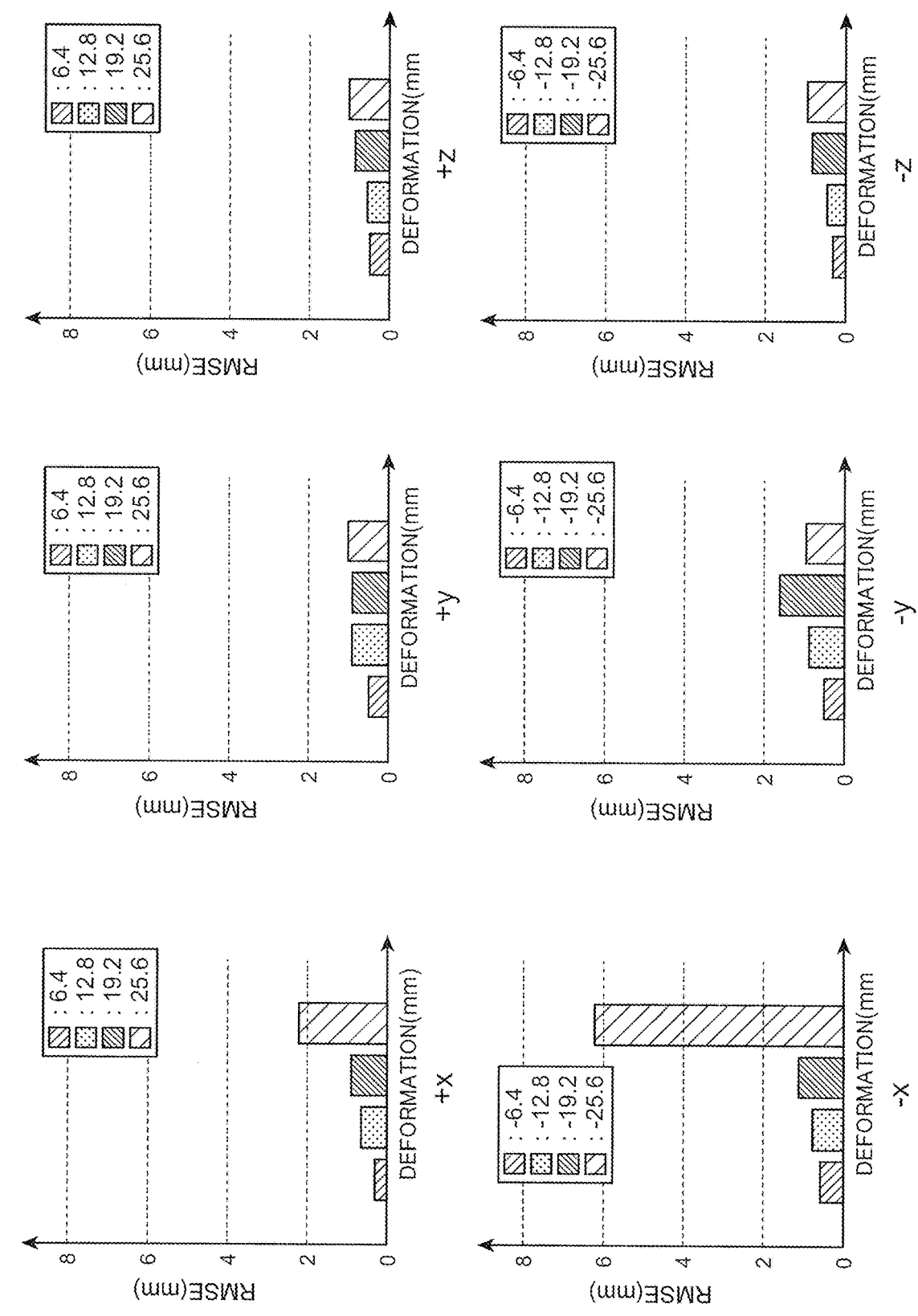
FIG. 13 is a diagram for illustrating magnitudes of local errors in a spherical mesh model forcibly displaced in each direction.
Figure 14:
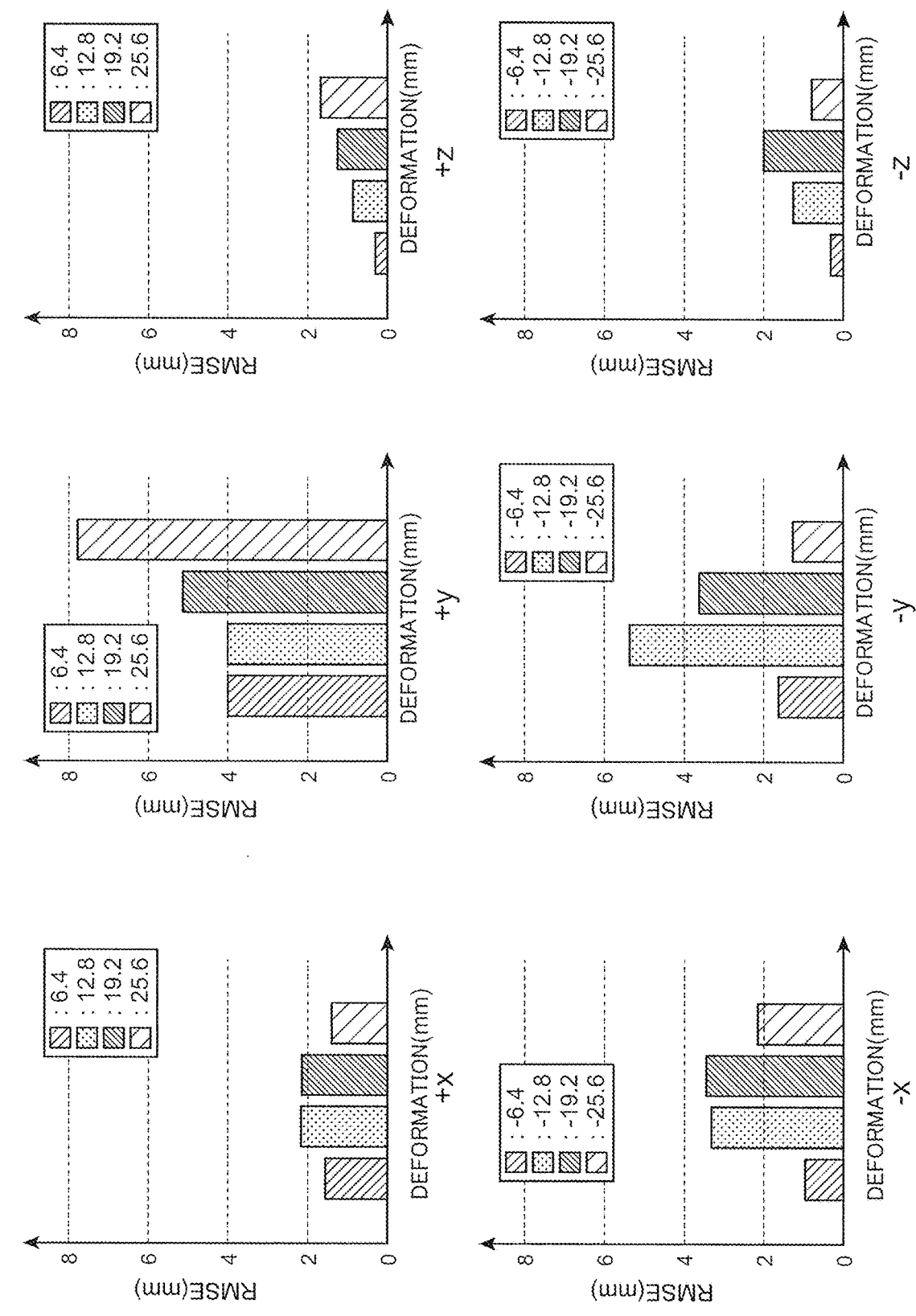
FIG. 14 is a diagram for illustrating magnitudes of local errors in a liver-shaped mesh model forcibly displaced in each direction.

FIG. 13 is a diagram for illustrating the magnitudes of local errors in the spherical mesh model 200 forcibly displaced in each direction. FIG. 14 is a diagram for illustrating the magnitudes of local errors in the liver-shaped mesh model 200A forcibly displaced in each direction.

FIGS. 13 and 14 show bar graphs each having the horizontal axis representing a displacement amount (mm) and the vertical axis representing a root mean square error (RMSE) (mm).

When the elastic body 1 is in the spherical shape (FIG. 13), the local error of the order of 6 mm appears only in the case where large forcible displacement is provided in the −x direction; however, in the cases of other directions, the local errors stay within about 1 mm.

When the elastic body 1 is in the liver shape (FIG. 14), the local error of the order of 8 mm appears only in the case where large forcible displacement is provided in the +y direction; however, in the cases of other directions, the local errors stay within about 2 mm to 3 mm.

<Conclusion>

According to the aforementioned Experiment 1 and Experiment 2, it was confirmed that the displacement amount of the mesh model 200 (or 200A) was able to be estimated with the estimation error of the order of 8.6% on average by only providing the information processing device 10 with a single camera image of the forcibly-displaced elastic body 1 captured by the single image-capturing camera 20 from one direction.

In other words, according to the method related to the exemplary embodiment, for all the nodes (the whole volume) constituting the mesh models 200 and 200A with sufficient accuracy only from two-dimensional appearance of target substances, local displacement can be reconfigured with high accuracy.

Note that, when the elastic body 1 is spherical, the error is increased in the case where large displacement is provided in the −x direction, and one of the causes thereof is considered that the CMA-ES uses the random numbers.

Consequently, the estimation error can be reduced by increasing the number of times of execution of the estimation processing until the final estimation result is obtained to five or more, or by using the optimum value of the parameter $\lambda$ in accordance with image capturing conditions (for example, a region to be captured, an illumination amount and so forth).

Moreover, when the elastic body 1 is in the liver shape, the error is increased in the case where large displacement is provided in the +y direction, and the cause thereof is considered that, since the +y direction is the same as a sight direction of the image-capturing camera 20, change in the brightness within the camera image appearing corresponding to deformation of the elastic body 1 in the direction in parallel with the sight direction is small. In this case, it is assumed that the estimation error can be reduced by capturing deformation of the elastic body 1 from a different direction.

In the calculation processing of the displacement amount by use of the finite element method adopted in the aforementioned Experiments 1 and 2 (directly, the calculation processing of the magnitude f of the external force F), while assuming that the distribution of the elastic modulus in the elastic body 1 is uniform, an absolute value of the elastic modulus is regarded to be unobserved.

Therefore, though a difference between the absolute value of the elastic modulus used in the calculation and an actual elastic modulus is expected, the calculation of the magnitude f (the vector) of the external force F is not hindered even if the absolute value of the elastic modulus is unobserved.

<Evaluation of Shape Error Using Pig's Liver>

Hereinafter, description will be given of a result of evaluation, in which a piece of a pig's liver was used as an observation object, and a likelihood of the calculated external force constraint f* was evaluated as a difference between the shape identified by the calculated external force constraint f* and a true value.

Note that, as the true value, CT data of the piece of the liver was used. Moreover, as the shape identified by the external force constraint f*, a shape generated by deforming the mesh model by the external force constraint f*, the mesh model being formed from the CT data of the piece of the liver in the initial shape, was used.

<Method of Experiment>

FIGS. 15A-15C show diagrams of camera images of the piece of pig's liver used in the experiment. FIG. 15A depicts an initial shape before the external force F is applied; FIG. 15B depicts a deformed shape 1 after being deformed by an external force F1; and FIG. 15C depicts a deformed shape 2 after further being deformed by an external force F2.

In the experiment, a piece of the liver 300 of a porker commercially available was used.

The size of the piece of the liver 300 shown in FIGS. 15A-15C is approximately 200 mm×150 mm×100 mm.

To measure Young's modulus of the piece of the pig's liver 300, YAWASA manufactured by Tech Gihan Co., Ltd. was used. Local differences in stiffness due to vascular structures inside the organ were palpable. Note that the measurement values were totally about 5 kPa to 10 kPa.

To measure the piece of the pig's liver 300, the X-ray computed tomography scanner for animal testing was used.

The measurement was conducted in the state where a board 310 on which the piece of the liver 300 was placed was installed on a table of the computed tomography scanner.

FIG. 15A shows the initial shape of the piece of the liver 300. In conducting the experiment, the region enclosed by a broken line in the figure was stitched to the board by a fishing gut to serve as the fixed point Pf. In FIGS. 15B and 15C, the application directions of the external forces F1 and F2 providing forcible displacement to the piece of the liver 300 were depicted by arrows. Note that an attitude of the piece of the liver 300 was held by a frictional force with the board 310.

FIG. 15B depicts the shape (the deformed shape 1) after application of the external force F1 in the lower right direction of the figure to the lower right region of the figure of the piece of the liver 300 in the initial shape. FIG. 15C depicts the shape (the deformed shape 2) after application of the external force F2 in the upper right direction of the figure to the lower right region of the figure of the piece of the liver 300 in the deformed shape 1.

The camera image corresponding to each shape is taken by a single digital camera. Note that the image capturing directions are the same. Moreover, the piece of the liver 300 in each shape was captured by the computed tomography scanner, and thereby the CT data was obtained.

Subsequently, the estimation processing (refer to FIG. 3) will be described.

First, as preprocessing, the mesh models corresponding to the initial shape, the deformed shape 1 and the deformed shape 2 were generated from the CT data. For generating the mesh model, Avizo, geometry modeling software produced by Mercury Computer Systems, Inc., was used.

In each mesh model, it was assumed that the number of vertexes was 302 and the number of triangular elements was 600. However, there is no correspondence relationship between vertexes among the mesh models.

The camera image selectively extracts a region of the piece of the liver 300 from the image captured by the digital camera. That is, the background is deleted.

Note that, at the stage of capturing the initial shape, a camera parameter in the information processing device 10 (refer to FIG. 2) was adjusted so that the rendering image of the mesh model was most closely approximated to the camera image. Moreover, an average color of the piece of the liver 300 in the camera image was obtained and provided to each vertex of the mesh model as color information, to thereby perform rendering.

Thereafter, the external force constraint f* minimizing the evaluation function E (Equation 2) was determined to match the finite element model with the camera image corresponding to the deformed shape 1 or 2.

In the case of this experiment, since the degree of deformation from the initial shape to the deformed shape 2 was extremely large, the external force constraint f* providing deformation between times was estimated for two cases, one was the case of estimating the deformed shape 1 from the initial shape, and the other was the case of estimating the deformed shape 2 from the deformed shape 1 regarded as the initial shape.

FIGS. 16A-16C show diagrams of the finite element models corresponding to the respective initial shape, deformed shape 1 and deformed shape 2. FIG. 16A depicts the initial shape; FIG. 16B depicts the deformed shape 1; and FIG. 16C depicts the deformed shape 2.

FIGS. 16A-16C, the fixed point Pf and the control points Pc having been set are shown by being enclosed by broken lines.

In the case of this experiment, as described above, there exists no correspondence relationship between the vertexes of the respective shapes. For this reason, a shape error index referred to as a bidirectional distance between the shapes was adopted, to thereby serve as an index representing a difference between the mesh data of the deformed shape and the shape between the models of the estimated shapes.

Here, the bidirectional distance refers to a value obtained by calculating the distance from one shape to the other shape with the nearest vertex thereof bidirectionally. In other words, the bidirectional distance represents, not the distance between the corresponding points used for evaluation in the aforementioned simulation experiment (FIGS. 7 to 14), but the rough deviation between both shapes.

The value of the bidirectional distance can be calculated more accurately as the mesh of both shapes to be compared is denser. Therefore, when the estimation processing was finished, each of the estimated shape and the Ground truth shape (the piece of the pig's liver 300) was subjected to mesh division to increase the number of vertexes from 302 to about twenty thousands, and thereafter, the entire shape error (mm) was calculated by the bidirectional distance.

Hereinafter, by using FIGS. 17A-17C and 18A-18C, it is shown that the estimation result has high accuracy.

Figure 17C:
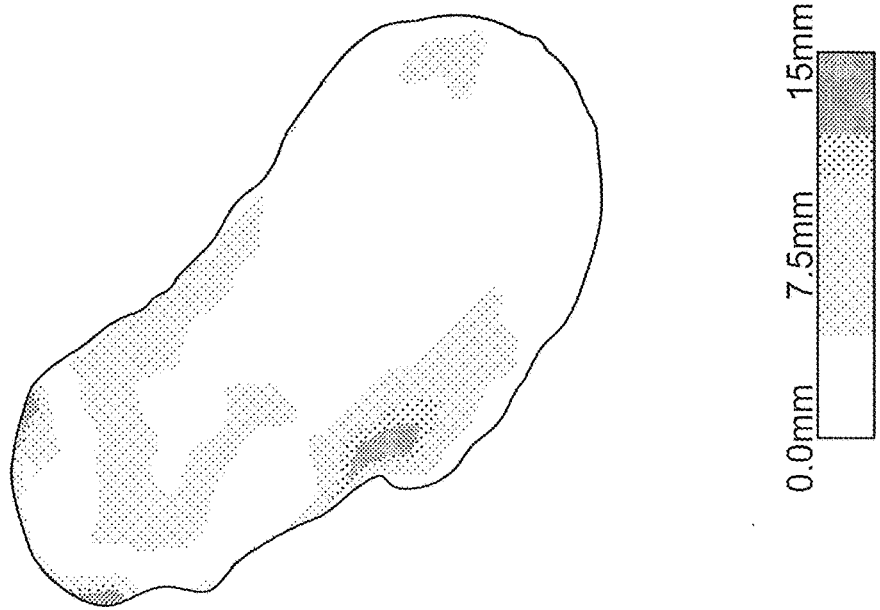
FIGS. 17A-17C show diagrams illustrating shape errors resulting from estimation of the deformed shape 1 using the initial shape as an input.
Figure 17B:
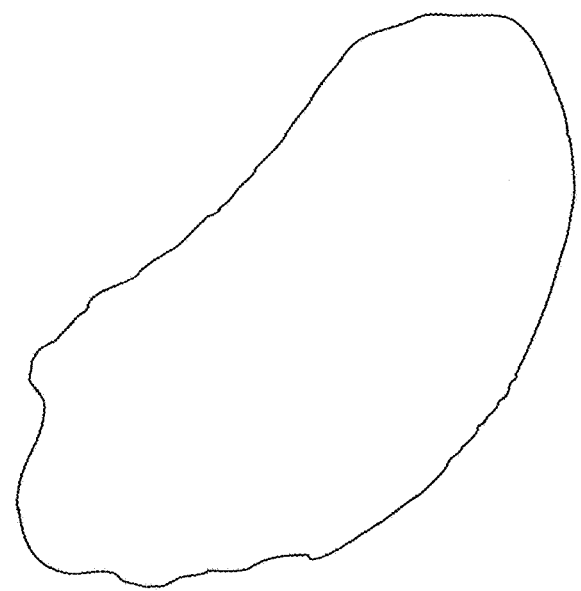
Figure 17A:
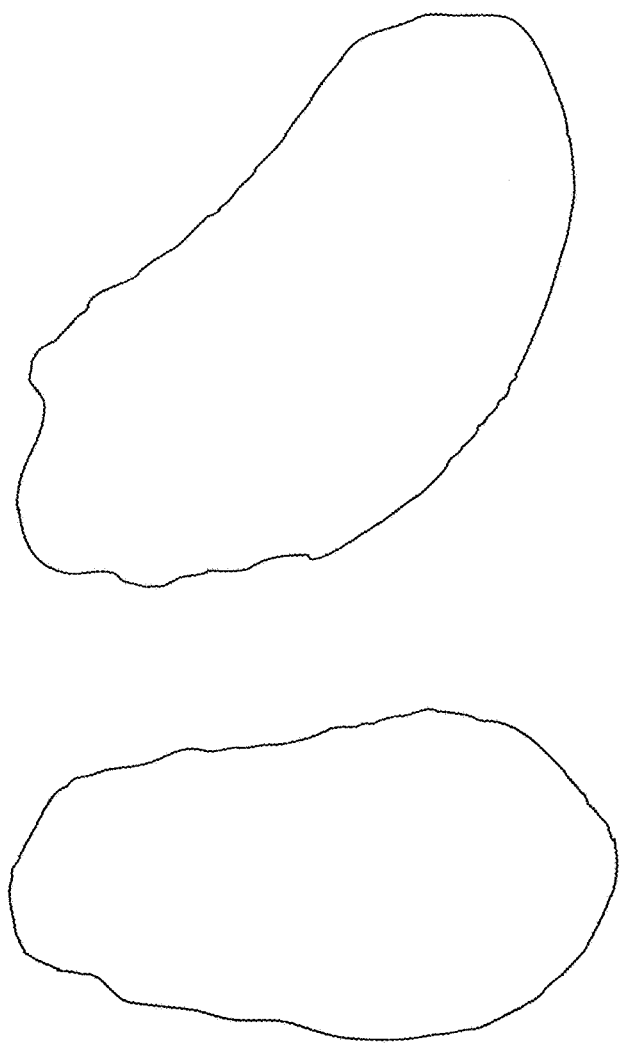

FIGS. 17A-17C show diagrams illustrating the shape errors resulting from estimation of the deformed shape 1 using the initial shape as an input. FIG. 17A shows the initial shape as an input shape; FIG. 17B shows the deformed shape 1 estimated from the external force constraints f*; and FIG. 17C is a display in which the local errors are mapped into the Ground truth shape.

FIGS. 18A-18C show diagrams illustrating the shape errors resulting from estimation of the deformed shape 2 using the deformed shape 1 as the input. FIG. 18A shows the deformed shape 1 as the input shape; FIG. 18B shows the deformed shape 2 estimated from the external force constraints f*; and FIG. 18C is a display in which the local errors are mapped into the Ground truth shape.

Moreover, in Table 2, various kinds of numerical values serving as indexes of the estimation accuracy are shown. Here, the average value and the maximum value of the initial value of the bidirectional distance, and the average value and the maximum value of the bidirectional distance after being estimated are shown. All of them shall be expressed in mm as a unit.

errors are observed at two points near the fixed point Pf and at the front region on the left side; however, it can be confirmed that the errors are rarely generated as a whole.

It is considered that the reason why the local errors appear in the vicinity of the fixed point Pf is that the region is expanded in deformation, and as a result thereof, an upper end region is roundly deformed.

Note that the local error at the front region on the left side is considered to be a measurement error. Specifically, it is found to be a cause that a corrugation-like region, which could not confirmed in the initial shape (refer to FIG. 15A), appears in the deformed shape 1.

Note that the corrugation-like region was not modeled as the CT data because the corrugations were in intimate contact with one another at the time of capturing the initial shape.

On the other hand, in the case of the estimation result of the deformed shape 2 shown in FIG. 18B, relatively large local errors are observed at both ends of a tip end region and a depressed region in the vicinity of the center of the right side of the piece of the liver.

The reason why the local errors appear in these regions is considered that local deformation was generated by extensions and twists in deforming.

Other Exemplary Embodiments

In the above-described exemplary embodiment, the experiment was conducted for the case in which the distri-

TABLE 2

|  | Average of initial values of bidirectional distance | Maximum value of initial values of bidirectional distance | Average of bidirectional distances after estimation | Maximum value of bidirectional distances after estimation |
| --- | --- | --- | --- | --- |
| Initial shape to deformed shpe 1 | 53.59 | 127.07 | 5.37 | 21.95 |
| Deformed shape 1 to deformed shape 2 | 18.09 | 60.95 | 7.48 | 25.53 |

Unit: mm

For example, at the stage on the start of estimation of the external force constraint f* providing the deformed shape 1 from the initial shape, errors of 53 mm on average and 127 mm as the maximum value of the bidirectional distance are generated. However, at the stage where the external force constraint f* minimizing the evaluation function E was estimated, it was possible to reduce the average of the bidirectional distance to 5.3 mm, which is reduction by 90%, and also reduce the maximum value to 22 mm.

The result corresponds to the estimation error of about 8.2% for local deviation of the order of 120 mm at a maximum.

Moreover, for example, at the stage on the start of estimation of the external force constraint f* providing the deformed shape 2 from the deformed shape 1, errors of 18 mm on average and 60 mm as the maximum value of the bidirectional distance are generated. However, at the stage where the external force constraint f* minimizing the evaluation function E was estimated, it was possible to reduce the average of the bidirectional distance to 7.4 mm, and also reduce the maximum value to 23 mm.

In each case, significant error reduction was recognized.

In FIGS. 17A-17C and 18A-18C, specific distribution of the local errors can be confirmed.

For example, in the case of the estimation result of the deformed shape 1 shown in FIG. 17B, relatively large local bution of the elastic modulus in the elastic body 1 was uniform (there are no stiff regions and no soft regions); however, in the elastic body 1 to be actually handled, the distribution of the elastic modulus is not uniform in many cases. Even in such cases, capabilities of estimating the displacement amount in each region of the elastic body 1 for the entire volume only by using a single camera image have great practical effects.

Moreover, when the distribution of the elastic modulus is observed, by giving a precise distribution to the total stiffness matrix K in Equation 1, it is possible to estimate the displacement amount in each region of the elastic body 1 with more accuracy.

In the above-described exemplary embodiment, the regular term is used in Equation 3; however, depending on observation conditions, such as a case in which the manipulation point Pa of the external force F is observed in advance, addition of the regular term is not needed.

In the above-described exemplary embodiment, the monocular image-capturing camera 20 was used to capture the elastic body 1 from one direction; however, the elastic body 1 may be captured by a binocular image-capturing camera 20 (a so-called stereo camera) from one direction or by use of plural image-capturing cameras 20. In this case, plural camera images corresponding to parallax can be obtained.

In this case, the plural camera images are obtained at once; however, the above-described estimation processing may be executed by use of any one of them, or may be executed by use of the plural camera images. When the plural camera images are used, the magnitude f of the external force F minimizing the sum of the differences between individual camera images and the respective corresponding rendering images may be estimated.

In the above-described exemplary embodiment, the monocular image-capturing camera 20 was used to capture the elastic body 1 from one direction; however, the elastic body 1 may be captured from plural directions. The camera images corresponding to the plural directions may be captured from the plural directions at once by use of plural image-capturing cameras 20 or from differently-timed plural directions by the single monocular image-capturing camera 20.

In the above-described Experiment 2, the parameter λ=0.05 is used; however, when the magnitude f of the external force F is small, it may be possible that a large value is used to cause the differences in the magnitudes f of the external forces F to tend to be reflected in the evaluation.

In the above-described Experiments 1 and 2, to reduce the number of parameters of the external force constraint f*, the number of the candidate points of the manipulation point Pa of the external force F (the control points Pc) or the position of the fixed point Pf are assumed to be observed, but these pieces of information are not always needed.

In the aforementioned exemplary embodiment, description was given on the assumption that a static image was taken by the image-capturing camera 20; however, the image-capturing camera 20 may be an image-capturing unit capable of capturing the elastic body 1 as a dynamic image. In this case, a static image captured from the dynamic image having been taken may be used.

The information processing device 10 related to the exemplary embodiment can be utilized for various purposes. For example, while the information processing system 100 can be utilized for the medical support system that supports diagnosis or surgery by a doctor, the system 100 can be utilized in industrial fields other than the medical field, for purposes of observation or analysis, and for purposes of production and manufacturing.

For example, when the information processing system 100 is utilized as the medical support system, as described above, even though it is impossible to observe the entire image of an organ because of the limited view, local deformation of an entire organ of a patient, who is an object under study, can be estimated with high accuracy by use of a partial image (camera image) of the observable region.

So far, the exemplary embodiment according to the present invention has been described, but the technical scope of the present invention is not limited to the scope described in the above-described exemplary embodiment.

It is obvious from the following claims that various modifications and improvements added to the above-described exemplary embodiment are also included in the technical scope of the present invention.

REFERENCE SIGNS LIST

1: Elastic body
10: Information processing device
100: Information processing system
111: Mesh model generation unit
112: Deformation unit
113: Rendering unit
114: Optimization unit
115: Expression unit
200, 200A: Mesh model
F: External force
f: Magnitude of external force
Pa: Manipulation point
Pc: Control point
Pf: Fixed point

The invention claimed is:

1. An information processing device comprising:
a processor configured to:
determine an optimal solution of an unobserved external force to minimize a difference between a surface image of an incomplete portion of an elastic body and a rendering image as observed from a first direction, the surface image being an image of an observable region captured from the first direction, the rendering image being generated from a three-dimensional model of the entire elastic body elastically deformed by the unobserved external force.

2. The information processing device according to claim 1, wherein the processor is programmed to determine the optimal solution of the unobserved external force based on an equation as follows:

$$f^* = \mathrm{argmin}_f \Sigma |I_t(x) - J_t(x)| + \lambda |f|_2$$

where f* represents an external force constraint to minimize an evaluation function;
$I_t(x)$ represents the surface image with respect to time t and a pixel position x;
$J_t(x)$ represents the rendering image, obtained by rendering the three-dimensional model on a two-dimensional image with respect to time t and the pixel position x;
f represents magnitude of the unobserved external force;
λ represents a coefficient;
|| represents an absolute value; and
$||_1$ represents a one-dimensional norm.

3. The information processing device according to claim 1, further comprising:
a storage medium that stores the surface image,
wherein the processor is programmed to:
generate the rendering image.

4. The information processing device according to claim 1, further wherein the processor is programmed to:
express the three-dimensional model elastically deformed based on the unobserved external force determined as the optimal solution.

5. The information processing device according to claim 1, wherein the surface image is a static image captured from only the first direction.

6. The information processing device according to claim 1, wherein the surface image is a static image captured by a single image-capturing camera.

7. The information processing device according to claim 1, wherein a surface of the rendering image is provided with information of of the surface of the elastic body.

8. The information processing device according to claim 1, wherein the optimal solution is determined to minimize a sum of differences between plural surface images of the elastic body captured from different directions and individual plural rendering images corresponding to respective different directions.

9. The information processing device according to claim 1, wherein, by using a sum of absolute values of the unobserved external force as a constraint condition for the difference, the optimal solution is determined to minimize a sum of the constraint condition and the difference.

10. An information processing method comprising:
- a process of obtaining a surface image of an incomplete portion of an elastic body, the surface image being an image of an observable region captured from a first direction;
- a process of generating a rendering image as observed from the first direction from a three-dimensional model of the entire elastic body elastically deformed by an unobserved external force; and
- a process of determining an optimal solution of the unobserved external force to minimize a difference between the surface image and the rendering image.

11. A non-transitory computer readable medium storing a program causing a computer to execute:
- a process of obtaining a surface image of an incomplete portion of an elastic body, the surface image being an image of an observable region captured from a first direction;
- a process of generating a rendering image as observed from the first direction from a three-dimensional model of the entire elastic body elastically deformed by an unobserved external force; and
- a process of determining an optimal solution of the unobserved external force to minimize a difference between the surface image and the rendering image.

* * * * *